US012701741B2

(12) United States Patent (10) Patent No.: US 12,701,741 B2
Tega et al. (45) Date of Patent: Aug. 4, 2026

(54) SEMICONDUCTOR DEVICE AND MANUFACTURING METHOD OF SEMICONDUCTOR DEVICE

(71) Applicant: DENSO CORPORATION, Kariya-city (JP)

(72) Inventors: Naoki Tega, Kariya-city (JP); Takuma Katano, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 374 days.

(21) Appl. No.: 18/451,980

(22) Filed: Aug. 18, 2023

(65) Prior Publication Data

US 2023/0395710 A1 Dec. 7, 2023

Related U.S. Application Data

(63) Continuation of application No. PCT/JP2021/039895, filed on Oct. 28, 2021.

(30) Foreign Application Priority Data

Mar. 25, 2021 (JP) ................................. 2021-051536

(51) Int. Cl.
*H10D 30/66* (2025.01)
*H10D 62/10* (2025.01)
(Continued)

(52) U.S. Cl.
CPC ......... *H10D 30/665* (2025.01); *H10D 30/668* (2025.01); *H10D 62/107* (2025.01);
(Continued)

(58) Field of Classification Search
CPC ........... H10D 30/0291; H10D 30/0293; H10D 30/0295; H10D 30/0297; H10D 30/608;
(Continued)

(56) References Cited

U.S. PATENT DOCUMENTS 5,170,241 A * 12/1992 Yoshimura ........... H10D 62/393
257/E29.066
9,887,287 B1 2/2018 Lichtenwalner et al.
(Continued)

FOREIGN PATENT DOCUMENTS

JP 2009-141185 A 6/2009
JP 2017-220644 A 12/2017

*Primary Examiner* — Eric A. Ward
(74) *Attorney, Agent, or Firm* — Posz Law Group, PLC

(57) ABSTRACT

A semiconductor layer in a semiconductor device includes a drift region of a first conductivity type, a body region of a second conductivity type disposed above the drift region, a source region of the first conductivity type disposed above the body region, and a first contact region and a second contact region each having a higher concentration of second conductivity-type impurities than the body region. The first contact region is located in an active region, and reaches the body region beyond the source region. The second contact region is located in an intermediate region, reaches the body region beyond the source region, and extends around the source region along a peripheral edge of the source region. Concentration distributions of the second conductivity-type impurities in a depth direction of the first contact region and the second contact region match with each other.

11 Claims, 21 Drawing Sheets

(51) Int. Cl.
  *H10D 62/17* (2025.01)
  *H10D 62/832* (2025.01)
  *H10P 30/22* (2026.01)

(52) U.S. Cl.
  CPC ....... *H10D 62/393* (2025.01); *H10D 62/8325*
  (2025.01); *H10P 30/22* (2026.01)

(58) Field of Classification Search
  CPC .... H10D 30/66; H10D 30/662; H10D 30/663;
  H10D 30/664; H10D 30/667; H10D
  30/668; H10D 30/669; H10D 62/393;
  H10D 62/8325
  See application file for complete search history.

(56)          References Cited

U.S. PATENT DOCUMENTS

| | | | |
|---|---|---|---|
| 2008/0079079 A1* | 4/2008 | Noguchi | H10D 30/668 |
| | | | 257/355 |
| 2011/0140197 A1 | 6/2011 | Tomita et al. | |
| 2011/0291110 A1 | 12/2011 | Suzuki et al. | |
| 2015/0001553 A1 | 1/2015 | Kudou et al. | |
| 2015/0187877 A1 | 7/2015 | Park et al. | |
| 2016/0099316 A1 | 4/2016 | Arai et al. | |
| 2016/0322227 A1 | 11/2016 | Arai et al. | |
| 2019/0074373 A1* | 3/2019 | Kobayashi | H10D 62/157 |
| 2019/0172944 A1 | 6/2019 | Okumura | |
| 2020/0127086 A1* | 4/2020 | Okawa | H10D 62/106 |
| 2020/0203482 A1 | 6/2020 | Kaji et al. | |
| 2021/0013339 A1 | 1/2021 | Okumura | |
| 2021/0384343 A1 | 12/2021 | Takeuchi et al. | |
| 2022/0045172 A1 | 2/2022 | Kaji et al. | |
| 2022/0052176 A1* | 2/2022 | Chen | H10D 62/8325 |

* cited by examiner

SEMICONDUCTOR DEVICE AND MANUFACTURING METHOD OF SEMICONDUCTOR DEVICE

CROSS REFERENCE TO RELATED APPLICATIONS

The present application is a continuation application of International Patent Application No. PCT/JP2021/039895 filed on Oct. 28, 2021, which designated the U.S. and claims the benefit of priority from Japanese Patent Application No. 2021-051536 filed on Mar. 25, 2021. The entire disclosures of all of the above applications are incorporated herein by reference.

TECHNICAL FIELD

The present disclosure relates to a semiconductor device and a manufacturing method of a semiconductor device.

BACKGROUND

There has been known a manufacturing method of a semiconductor device in which a body region of p-type and a source region of n-type are formed using an ion implantation technique.

SUMMARY

A semiconductor device according to an aspect of the present disclosure includes a semiconductor layer including a drift region of a first conductivity type, a body region of a second conductivity type disposed above the drift region, a source region of the first conductivity type disposed above the body region, and a first contact region and a second contact region each having a higher concentration of second conductivity-type impurities than the body region. The first contact region is located in an active region, and reaches the body region beyond the source region. The second contact region is located in the intermediate region, reaches the body region beyond the source region, and extends around the source region along a peripheral edge of the source region. Concentration distributions of the second conductivity-type impurities in a depth direction of the first contact region and the second contact region match with each other.

A manufacturing method of a semiconductor device according to another aspect of the present disclosure includes preparing a semiconductor layer of a first conductivity type, forming a first mask, forming a body region, forming a source region, forming a second mask, forming a contact region, and a forming a trench gate. The second mask is formed on a first main surface of the semiconductor layer. The second mask has an inner peripheral opening formed at a predetermined position of an active region and an outer peripheral opening formed along a peripheral edge of the source region so as to expose the peripheral edge of the source region. The contact region includes a first contact region and a second contact region, and is formed by implanting ions of second conductivity-type impurities toward the first main surface of the semiconductor layer through the second mask. The first contact region is formed at a position in the semiconductor layer corresponding to the inner peripheral opening of the second mask. The first contact region reaches the body region beyond the source region, and has a higher concentration of the second conductivity-type impurities than the body region. The second contact region is formed at a position in the semiconductor layer corresponding to the outer peripheral opening of the second mask. The second contact region reaches the body region beyond the source region, and has a higher concentration of the second conductivity-type impurities than the body region.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
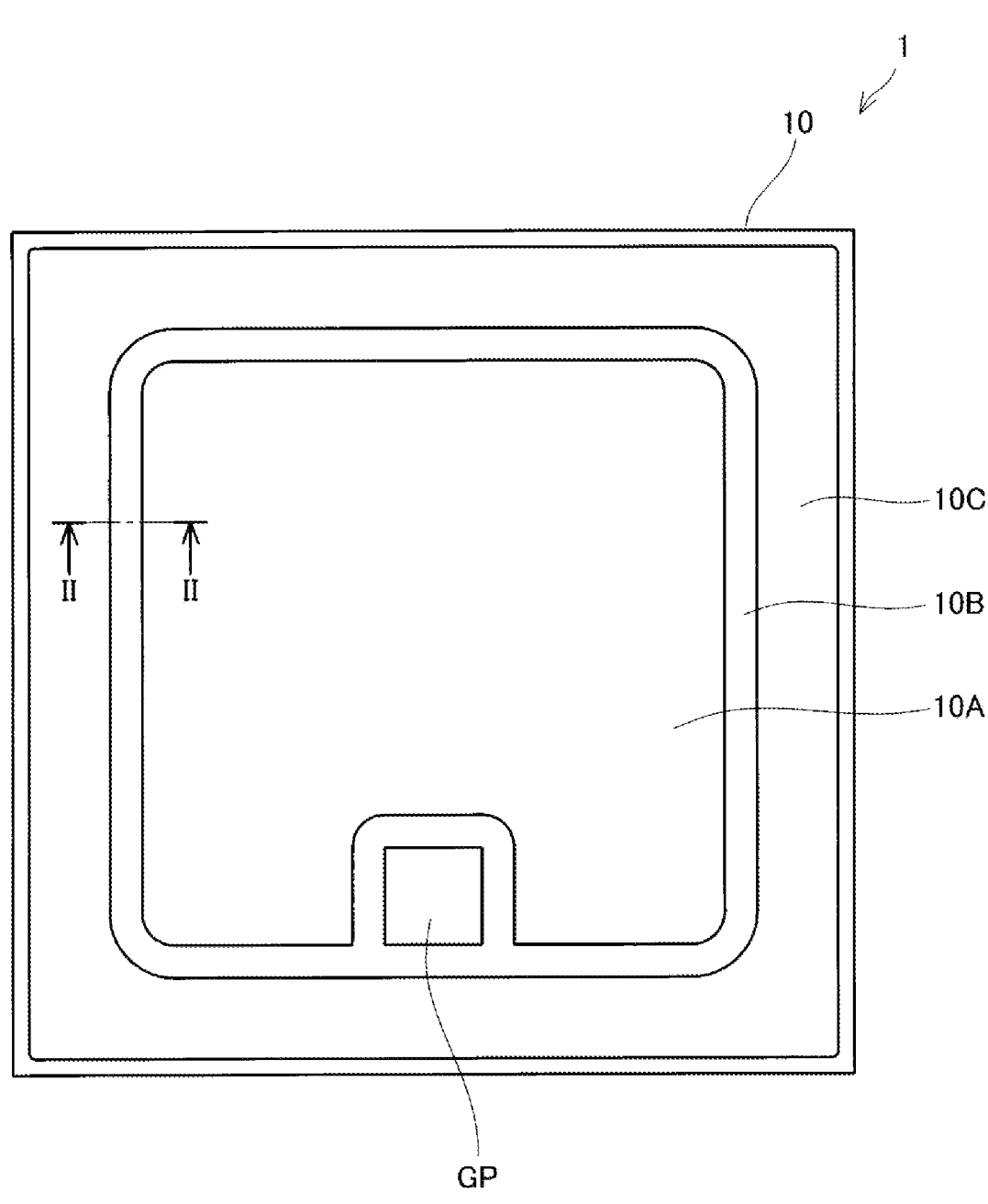
FIG. 1 is a diagram illustrating a positional relationship among an active region, an intermediate region, and an outer peripheral region defined in a semiconductor layer when the semiconductor layer is viewed from above.

Next, a relevant technology is described only for understanding the following embodiments. In a manufacturing method of a semiconductor device in the relevant technology, a body region of p-type and a source region of n-type are formed by using an ion implantation technique. The body region spreads in a planar manner at a predetermined depth of a semiconductor layer. The source region spreads in a planar manner at a position that is shallower than the body region and is exposed to a main surface of the semiconductor layer. In this manufacturing method, a contact region of p-type is further formed by counter-doping to the source region using an ion implantation technique.

In this type of semiconductor device, a trench gate is often adopted as a gate structure. In the above-described manufacturing method, the trench gate is formed in an active region of the semiconductor layer so as to penetrate the body region and the source region which spread in the planar manner. Normally, the trench gate located in the active region is formed on an inner peripheral side than the body region that spreads in the planar manner. Thus, the body region and the source region that spread in the planar manner are present on an outer peripheral side than an outermost peripheral end portion of the trench gate located in the active region.

The body region is often formed with a relatively low impurity concentration in consideration of a gate threshold voltage and a channel resistance. Therefore, as a result of studies by the present inventors, it has been found that the potential of the body region located on the outer peripheral side than the trench gate may become unstable depending on the area thereof.

A semiconductor device according to an aspect of the present disclosure includes a semiconductor layer having a first main surface and a second main surface, and a trench gate. The semiconductor layer is divided into an active region, an outer peripheral region, and an intermediate region. The outer peripheral region extends around a periphery of the active region. The intermediate region is located between the active region and the outer peripheral region and extends around the periphery of the active region. The semiconductor layer includes a drift region, a body region, a source region, a first contact region, and a second contact region. The drift region of a first conductivity type is located in the active region, the intermediate region and the outer peripheral region. The body region of a second conductivity type is located in the active region and the intermediate region and is disposed above the drift region. The source region of the first conductivity type is located in the active region and the intermediate region and is disposed above the body region. The first contact region of the second conductivity type is located in the active region, reaches the body region beyond the source region, and has a higher concentration of second conductivity-type impurities than the body region. The second contact region of the second conductivity type is located in the intermediate region, reaches the body region beyond the source region, extends around the source region along a peripheral edge of the source region, and has a higher concentration of the second conductivity-type impurities than the body region. The trench gate is located in the active region and extends from the first main surface beyond the source region and the body region. Concentration distributions of the second conductivity-type impurities in a depth direction of the first contact region and the second contact region match with each other.

In the semiconductor device, the second contact region is located in the intermediate region on an outer peripheral side than the trench gate. The second contact region is in contact with the body region. Therefore, the potential of the body region located on the outer peripheral side than the trench gate is stabilized. Furthermore, in the semiconductor device, since the concentration distributions of the second conductivity-type impurities in the depth direction of the first contact region and the second contact region match with each other, the first contact region and the second contact region can be simultaneously formed. In other words, the second contact region can be formed simultaneously with a process of forming the first contact region without increasing the number of processes dedicated to forming the second contact region. Therefore, the semiconductor device has a structure that can be manufactured at low cost. As described above, the semiconductor device can be manufactured at low cost, and the potential of the body region located on the outer peripheral side than the trench gate can be stabilized.

A manufacturing method of a semiconductor device according to another aspect of the present disclosure includes preparing a semiconductor layer of a first conductivity type, forming a first mask, forming a body region, forming a source region, forming a second mask, forming a contact region, and a forming a trench gate. The semiconductor layer has a first main surface and a second main surface and is divided into an active region, an outer peripheral region, and an intermediate region. The outer peripheral region extends around a periphery of the active region. The intermediation region is located between the active region and the outer peripheral region and extends around the periphery of the active region. The first mask is formed on the first main surface of the semiconductor layer and has an opening at a position corresponding to the active region and the intermediate region. The body region is formed in the semiconductor layer by implanting ions of second conductivity-type impurities toward the first main surface of the semiconductor layer through the first mask. The source region is formed in a range shallower than the body region in the semiconductor layer by implanting ions of first conductivity-type impurities toward the first main surface of the semiconductor layer through the first mask. The second mask is formed on the first main surface of the semiconductor layer. The second mask has an inner peripheral opening formed at a predetermined position of the active region and an outer peripheral opening formed along a peripheral edge of the source region so as to expose the peripheral edge of the source region. The contact region includes a first contact region and a second contact region, and is formed by implanting ions of the second conductivity-type impurities toward the first main surface of the semiconductor layer through the second mask. The first contact region is formed at a position in the semiconductor layer corresponding to the inner peripheral opening of the second mask. The first contact region reaches the body region beyond the source region, and has a higher concentration of the second conductivity-type impurities than the body region.

The second contact region is formed at a position in the semiconductor layer corresponding to the outer peripheral opening of the second mask. The second contact region reaches the body region beyond the source region, and has a higher concentration of the second conductivity-type impurities than the body region. The trench gate is formed in the active region and extends from the first main surface beyond the source region and the body region.

In the manufacturing method, the body region and the source region can be formed using the common first mask. Therefore, the manufacturing method can manufacture the semiconductor device at low cost. Furthermore, in the manufacturing method, the first contact region and the second contact region can be formed using the common second mask. The second contact region is in contact with the body region located in the intermediate region. Therefore, the potential of the body region located in the intermediate region is stabilized. As described above, in the manufacturing method, the second contact region for stabilizing the potential of the body region located in the intermediate region can be formed simultaneously with a process of forming the first contact region without increasing the number of processes dedicated to forming the second contact region.

First Embodiment

Figure 2:
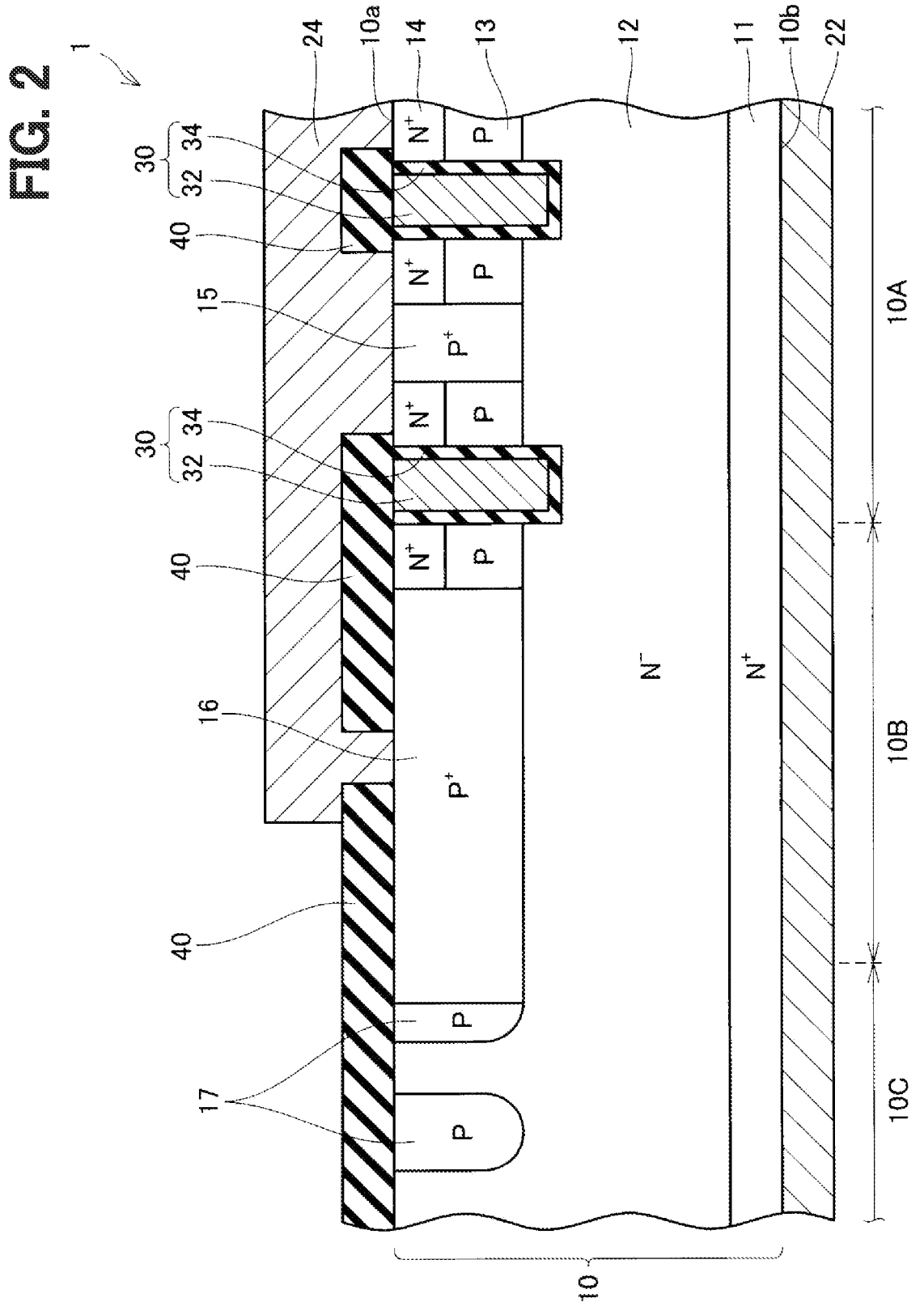
FIG. 2 is a diagram illustrating a cross-sectional view of a part of a semiconductor device of a first embodiment taken along line II-II in FIG. 1.

As illustrated in FIG. 1 and FIG. 2, a semiconductor device 1 of a first embodiment is a power device of a type called a metal-oxide-semiconductor field effect transistor (MOSFET), and is formed using a semiconductor layer 10. The material of the semiconductor layer 10 is not particularly limited, but may be silicon carbide (SiC), for example.

As illustrated in FIG. 1, the semiconductor layer 10 is divided into an active region 10A, an intermediate region 10B, and an outer peripheral region 10C when the semiconductor layer 10 is seen from above (hereinafter, it is referred to as "in plan view"). The active region 10A is a region located at a center of the semiconductor layer 10, and is a region in which a switching structure is formed as described later. The intermediate region 10B is a region located between the active region 10A and the outer peripheral region 10C, and extends around a periphery of the active region 10A. The outer peripheral region 10C is a region located around the active region 10A and the intermediate region 10B, and extends around the periphery of the active region 10A and a periphery of the intermediate region 10B. As will be described later, an outer peripheral high breakdown voltage structure is formed in the outer peripheral region 10C. A region indicated by "GP" in FIG. 1 indicates a region in which a gate pad is disposed.

As illustrated in FIG. 2, the semiconductor device 1 includes the semiconductor layer 10, a drain electrode 22, a source electrode 24, and a plurality of trench gates 30. The semiconductor layer 10 includes a drain region 11, a drift region 12, a body region 13, a source region 14, a first contact region 15, a second contact region 16, and a plurality of guard rings 17. As illustrated in FIG. 2, the active region 10A is a region in which the plurality of trench gates 30 is provided. The intermediate region 10B is a region from an end of an outermost one of the trench gates 30 located in the active region 10A to an end of an innermost guard ring in the plurality of guard rings 17 located in the outer peripheral region 10C. The outer peripheral region 10C is a region outside the innermost guard ring in the plurality of guard rings 17.

The drain electrode 22 covers a lower surface 10b of the semiconductor layer 10. The drain electrode 22 is disposed over the active region 10A, the intermediate region 10B, and the outer peripheral region 10C, and is in contact with the entire region of the lower surface 10b of the semiconductor layer 10.

The source electrode 24 covers an upper surface 10a of the semiconductor layer 10. The source electrode 24 is disposed over the entire range of the active region 10A and a part of the intermediate region 10B, and is in contact with the upper surface 10a of the semiconductor layer 10 exposed from an opening of an interlayer insulating film 40 formed on the upper surface 10a of the semiconductor layer 10.

The drain region 11 is an n-type layer containing n-type impurities at a high concentration. The drain region 11 is located over the active region 10A, the intermediate region 10B, and the outer peripheral region 10C, and is provided at a position exposed to the lower surface 10b of the semiconductor layer 10. The drain region 11 is in ohmic contact with the drain electrode 22. As will be described later, the drain region 11 is also a base substrate for epitaxially growing the drift region 12.

The drift region 12 is an n-type layer having a lower concentration of the n-type impurities than the drain region 11. The drift region 12 is located over the active region 10A, the intermediate region 10B, and the outer peripheral region 10C. The drift region 12 is in contact with a side surface and a bottom surface of each of the trench gates 30.

The body region 13 is a p-type layer containing p-type impurities at a low concentration. The body region 13 is located over the entire range of the active region 10A and a partial range of the intermediate region 10B, and is provided on the drift region 12. The body region 13 is formed to spread in a planar manner from the upper surface 10a of the semiconductor layer 10 to a predetermined depth, and is in contact with a lower portion of the side surface of each of the trench gates 30. The body region 13 is disposed so as to separate the drift region 12 and the source region 14 from each other.

The source region 14 is an n-type layer containing n-type impurities at a high concentration. The source region 14 is located over the entire range of the active region 10A and the partial range of the intermediate region 10B, and is disposed above the body region 13. The source region 14 is formed to spread in a planar manner at a position exposed to the upper surface 10a of the semiconductor layer 10, and is in contact with an upper portion of the side surface of each of the trench gates 30. The source region 14 is exposed from an opening portion of the interlayer insulating film 40 formed on the upper surface 10a of the semiconductor layer 10, and is in ohmic contact with the source electrode 24.

The first contact region 15 is a p-type layer containing p-type impurities at a higher concentration than the body region 13. The first contact region 15 is located in the active region 10A, and extends parallel to a longitudinal direction of the trench gates 30 when the semiconductor layer 10 is seen in plan view. The first contact region 15 extends from one end to the other end in the longitudinal direction of the trench gates 30 when the semiconductor layer 10 is seen in plan view. The first contact region 15 is formed from the upper surface 10a of the semiconductor layer 10 to reach the body region 13 beyond the source region 14, and is in contact with the body region 13. In this example, a depth of a bottom surface of the first contact region 15 is substantially equal to a depth of a bottom surface of the body region 13. Instead of this example, the bottom surface of the first contact region 15 may be at a position shallower than the bottom surface of the body region 13. The first contact region 15 is exposed from an opening of the interlayer insulating film 40 formed on the upper surface 10a of the semiconductor layer 10, and is in ohmic contact with the source electrode 24. Thus, the body region 13 in the active region 10A is fixed to a potential of the source electrode 24 through the first contact region 15.

Figures 3A, 3B:
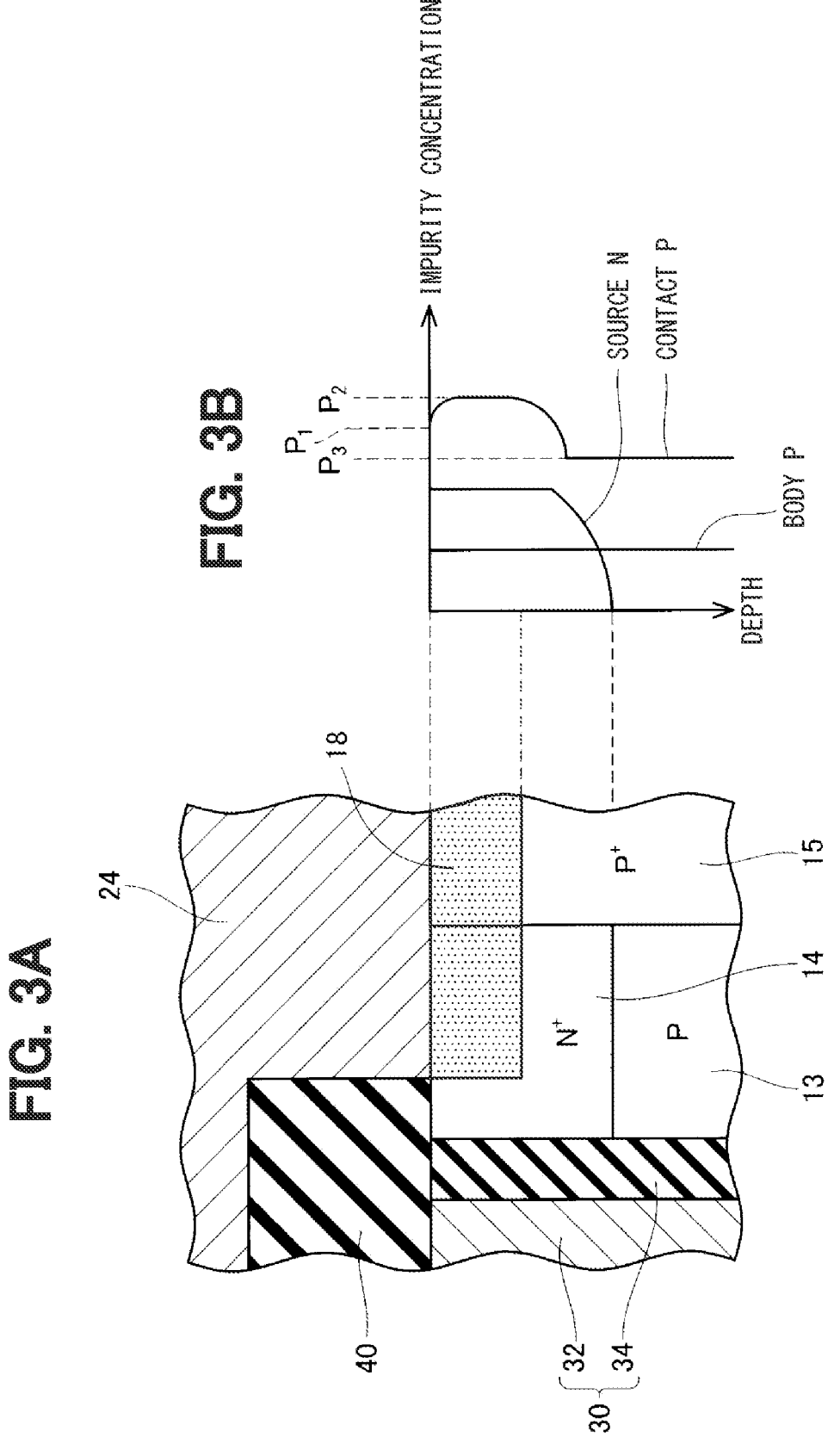
FIG. 3A is an enlarged cross-sectional view of a part of the semiconductor device in the vicinity of a connection portion between a first contact region and a source electrode.
FIG. 3B is a diagram illustrating impurity concentration profiles in a depth direction of a body region, a source region, and the first contact region.

FIG. 3A is an enlarged cross-sectional view of a connection portion between the first contact region 15 and the source electrode 24. FIG. 3B is a diagram illustrating impurity concentration profiles in a depth direction of the body region 13, the source region 14, and the first contact region 15. In FIG. 3B, "Body P" indicates the concentration profile in the depth direction of the p-type impurities included in the body region 13, "source N" indicates the concentration profile in the depth direction of the n-type impurities included in the source region 14, and "contact P" indicates the concentration profile in the depth direction of the p-type impurity included in the first contact region 15.

As shown in FIG. 3A, a silicide layer 18 is formed in a portion of each of the source region 14 and the first contact region 15 in contact with the source electrode 24. For example, the silicide layer 18 has a thickness of 50 to 200 nm. The first contact region 15 is adjusted so that the concentration of the p-type impurities becomes high in the depth range in which the silicide layer 18 is formed, particularly at a depth corresponding to a bottom surface of the silicide layer 18. Here, the concentration of the p-type impurities of the first contact region 15 in a junction surface between the first contact region 15 and the source electrode 24 is $P_1$, the maximum concentration of the p-type impurities in the depth direction of the first contact region 15 is $P_2$, and the concentration of the p-type impurities of the first contact region 15 in a depth corresponding to a junction surface between the body region 13 and the source region 14 is $P_3$. Although not particularly limited, for example, $P_1$ may be $1\times10^{17}$ to $1\times10^{20}$ cm$^{-3}$, $P_2$ may be $1\times10^{19}$ to $1\times10^{21}$ cm$^{-3}$, and $P_3$ may be $1\times10^{17}$ to $1\times10^{20}$ cm$^{-3}$. $P_3$ is adjusted to be higher than the impurity concentration of the source region 14.

The concentration profile in the depth direction of the p-type impurities included in the first contact region 15 satisfies relationships of $P_1 < P_2$ and $P_3 < P_2$. In other words, the first contact region 15 has a concentration profile such that the maximum concentration of the p-type impurities is located in the semiconductor layer 10 and the vicinity of the bottom surface of the silicide layer 18 has the maximum concentration. With the above-described concentration profile, it is possible to reduce the dose of the p-type impurities when the first contact region 15 is formed by an ion implantation process while reducing a contact resistance between the first contact region 15 and the source electrode 24.

Returning to FIG. 2. The second contact region 16 is located in the intermediate region 10B and is a P-type layer containing p-type impurities at a higher concentration than the body region 13. The second contact region 16 is formed from the upper surface 10a of the semiconductor layer 10 to reach the body region 13 beyond the source region 14, and is in contact with the body region 13. In this example, a depth of a bottom surface of the second contact region 16 is substantially equal to the depth of the bottom surface of the body region 13. Instead of this example, the bottom surface of the second contact region 16 may be at a position shallower than the bottom surface of the body region 13. The second contact region 16 is disposed to cover peripheral edges of the body region 13 and the source region 14, and extends around the body region 13 and the source region 14 along the peripheral edges of the body region 13 and the source region 14. An inner end portion of the second contact region 16 is in contact with the body region 13 and the source region 14, and an outer end portion of the second contact region 16 is in contact with the innermost one of the guard rings 17. The second contact region 16 is exposed from an opening of the interlayer insulating film 40 formed on the upper surface 10a of the semiconductor layer 10, and is in ohmic contact with the source electrode 24. Thus, the body region 13 in the intermediate region 10B is fixed to the potential of the source electrode 24 through the second contact region 16.

As will be described later, the first contact region 15 and the second contact region 16 are formed by the same ion implantation process. Therefore, concentration distributions the p-type impurities in the depth direction of the first contact region 15 and the second contact region 16 match with each other. Similarly to the first contact region 15, a silicide layer is formed in a portion of the second contact region 16 in contact with the source electrode 24. As described above, also in the second contact region 16, similarly to the first contact region 15, it is possible to reduce the dose of the p-type impurities when the second contact region 16 is formed by the ion implantation process while reducing the contact resistance between the second contact region 16 and the source electrode 24.

Each of the guard rings 17 is located in the outer peripheral region 10C and is a p-type layer containing p-type impurities. Each of the guard rings 17 is formed so as to reach a predetermined depth from the upper surface 10a of the semiconductor layer 10, and extends around the periphery of the active region 10A and the periphery of the intermediate region 10B along the outer peripheral region 10C. The guard rings 17 are an example of an outer peripheral high breakdown voltage structure, and play a role of extending a depletion layer to the outside and relaxing electric field concentration when the semiconductor device 1 is turned off. Instead of the guard rings 17, for example, a reduced surface Field (RESURF) layer may be provided as an outer peripheral high breakdown voltage structure.

The trench gates 30 are arranged in the active region 10A, and are formed from the upper surface 10a of the semiconductor layer 10 to reach the drift region 12 beyond the source region 14 and the body region 13. When the semiconductor layer 10 is seen in plan view, each of the trench gates 30 extends in one direction in the active region 10A, and extends from one end to the other end of the active region 10A.

Thus, the trench gates 30 are arranged in a stripe shape in plan view of the semiconductor layer 10. The arrangement of the trench gates 30 is not limited to the stripe shape and may be other layouts. Each of the trench gates 30 includes a gate electrode 32 and a gate insulating film 34. The gate electrode 32 is insulated from the drift region 12, the body region 13, and the source region 14 by the gate insulating film 34, and is insulated from the source electrode 24 by the interlayer insulating film 40. The gate electrode 32 is electrically connected to the gate pad GP (see FIG. 1). A material of the gate electrode 32 is not particularly limited, but may be, for example, silicon oxide ($SiO_2$). A material of the gate insulating film 34 is not particularly limited, but may be, for example, polycrystalline silicon.

As described above, in the active region 10A, the switching structure is formed by the drain electrode 22, the drain region 11, the drift region 12, the body region 13, the source region 14, the first contact region 15, the source electrode 24, the trench gates 30, and the like.

Next, the operation of the semiconductor device 1 will be described. When a voltage equal to or higher than the gate threshold voltage is applied to the gate electrode 32 in a state where a voltage is applied between the drain electrode 22 and the source electrode 24 such that a potential of the drain electrode 22 is higher than a potential of the source electrode 24, a channel is formed at a portion of the body region 13 adjacent to the gate insulating film 34. Electrons supplied from the source region 14 can flow into the drift region 12 via this channel. As a result, conduction occurs between the drain electrode 22 and the source electrode 24, and the semiconductor device 1 is turned on. On the other hand, when a voltage lower than the gate threshold voltage is applied to the gate electrode 32, the channel disappears and the semiconductor device 1 is turned off. In this way, the semiconductor device 1 can function as a switching element for controlling a current flowing between the drain electrode 22 and the source electrode 24 in accordance with the voltage applied to the gate electrode 32.

Figure 4:
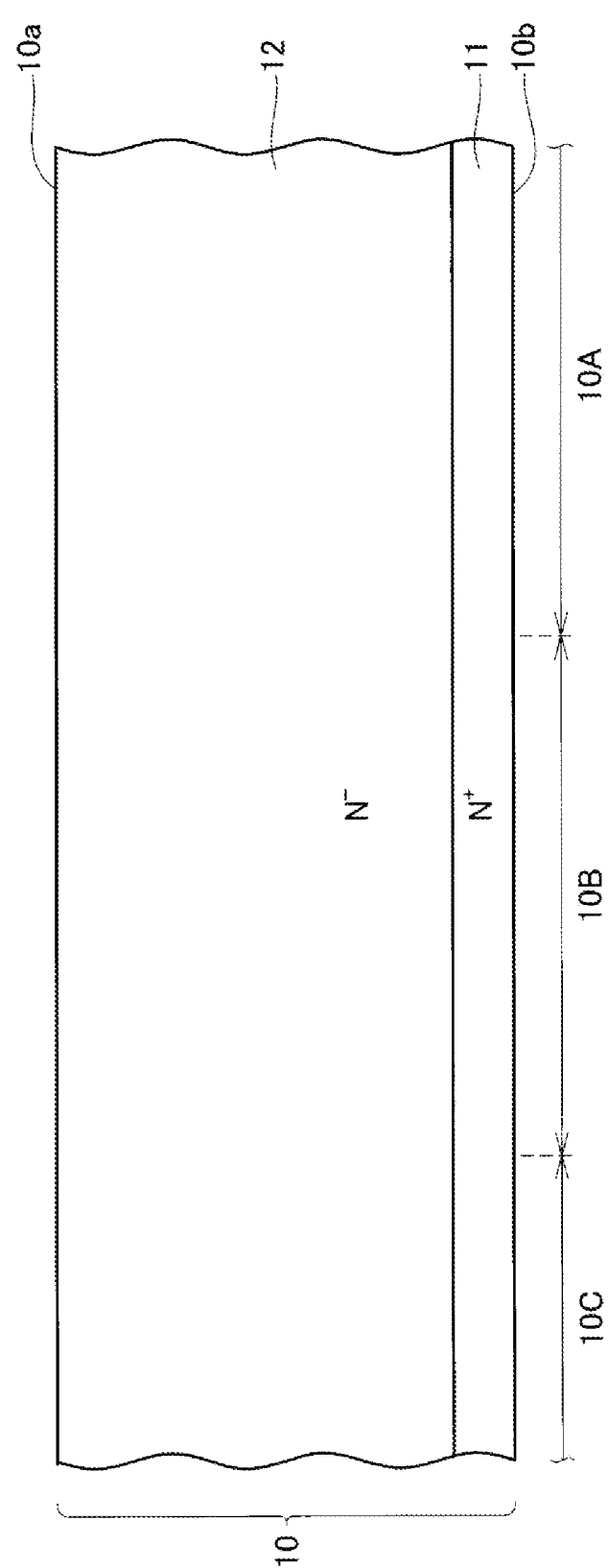
FIG. 4 is a diagram illustrating a cross-sectional view of a part of the semiconductor device in a process of manufacturing the semiconductor device.

Next, a manufacturing method of the semiconductor device 1 will be described. First, as shown in FIG. 4, an SiC substrate functioning as the drain region 11 is prepared. The SiC substrate is not particularly limited, but may have, for example, a n-type impurity concentration of $1\times10^{18}$ to $1\times10^{19}$ $cm^{-3}$ and a thickness of 350 to 500 μm. Next, crystal growth of the drift region 12 is performed from the upper surface of the drain region 11 using an epitaxial growth technique. The drift region 12 is not particularly limited, but may have, for example, an n-type impurity concentration of $1\times10^{15}$ to $1\times10^{17}$ $cm^{-3}$ and a thickness of 5 to 100 μm. Accordingly, the semiconductor layer 10 in which the drain region 11 and the drift region 12 are stacked is prepared.

Figure 5:
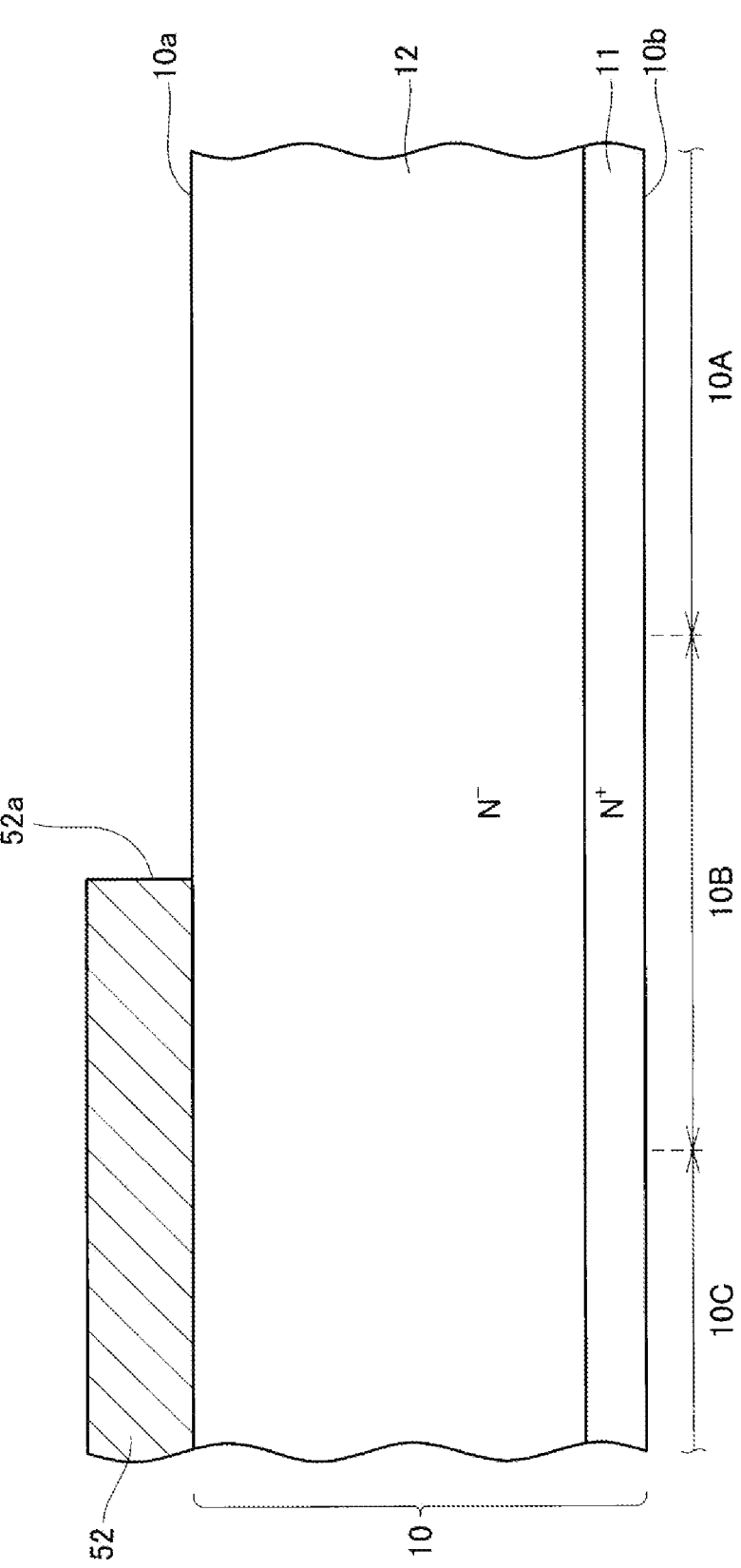
FIG. 5 is a diagram illustrating a cross-sectional view of the part of the semiconductor device in a process of manufacturing the semiconductor device subsequent to the process illustrated in FIG. 4.

Next, as shown in FIG. 5, a mask 52 is deposited on the upper surface 10a of the semiconductor layer 10 by using a chemical vapor deposition (CVD) technique and a photolithography technique. This process is an example of a first mask deposition process. The mask 52 has an opening 52a corresponding to the entire range of the active region 10A and a partial range of the intermediate region 10B. As will be described later, the mask 52 may also have openings corresponding to the guard rings 17 to be formed in the outer peripheral region 10C.

Figure 6:
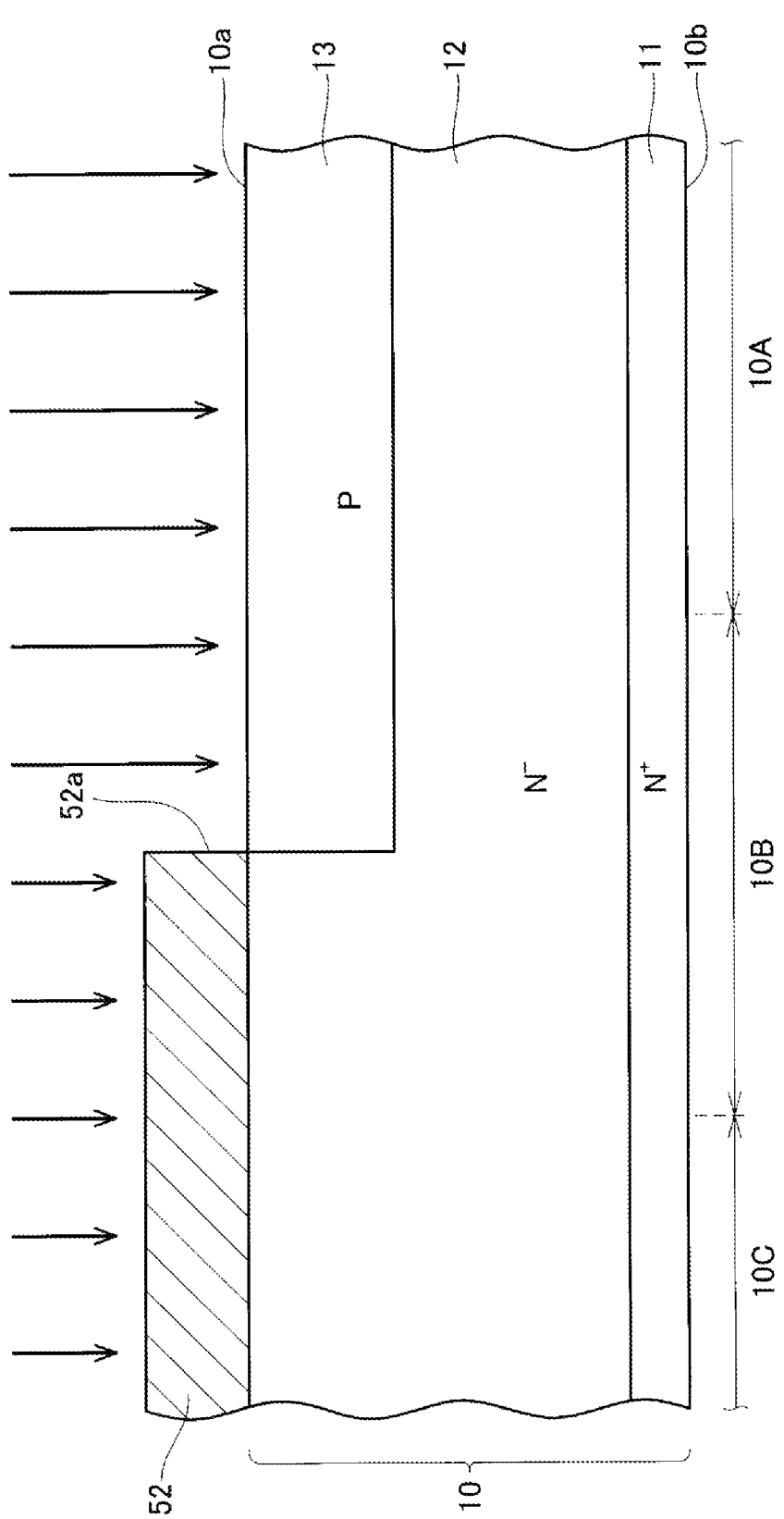
FIG. 6 is a diagram illustrating a cross-sectional view of the part of the semiconductor device in a process of manufacturing the semiconductor device subsequent to the process illustrated in FIG. 5.

Next, as shown in FIG. 6, aluminum ions are implanted in multiple stages toward the upper surface 10a of the semiconductor layer 10 exposed from the opening 52a to form the mask 52 using an ion implantation technique to form the body region 13. This process is an example of a body region forming process. The body region 13 is formed so as to spread in the planar manner in the entire range of the active region 10A and the partial range of the intermediate region 10B of the semiconductor layer 10. The ion implantation process is not particularly limited. For example, the dose may be $1\times10^{11}$ to $1\times10^{14}$ $cm^{-2}$ and the implantation energy may be 10 to 1500 eV.

Although the body region 13 is not particularly limited, for example, a peak concentration of the p-type impurities may be $1\times10^{17}$ to $1\times10^{18}$ $cm^{-3}$, and a depth of the bottom surface may be 0.5 to 1.5 μm.

Figure 7:
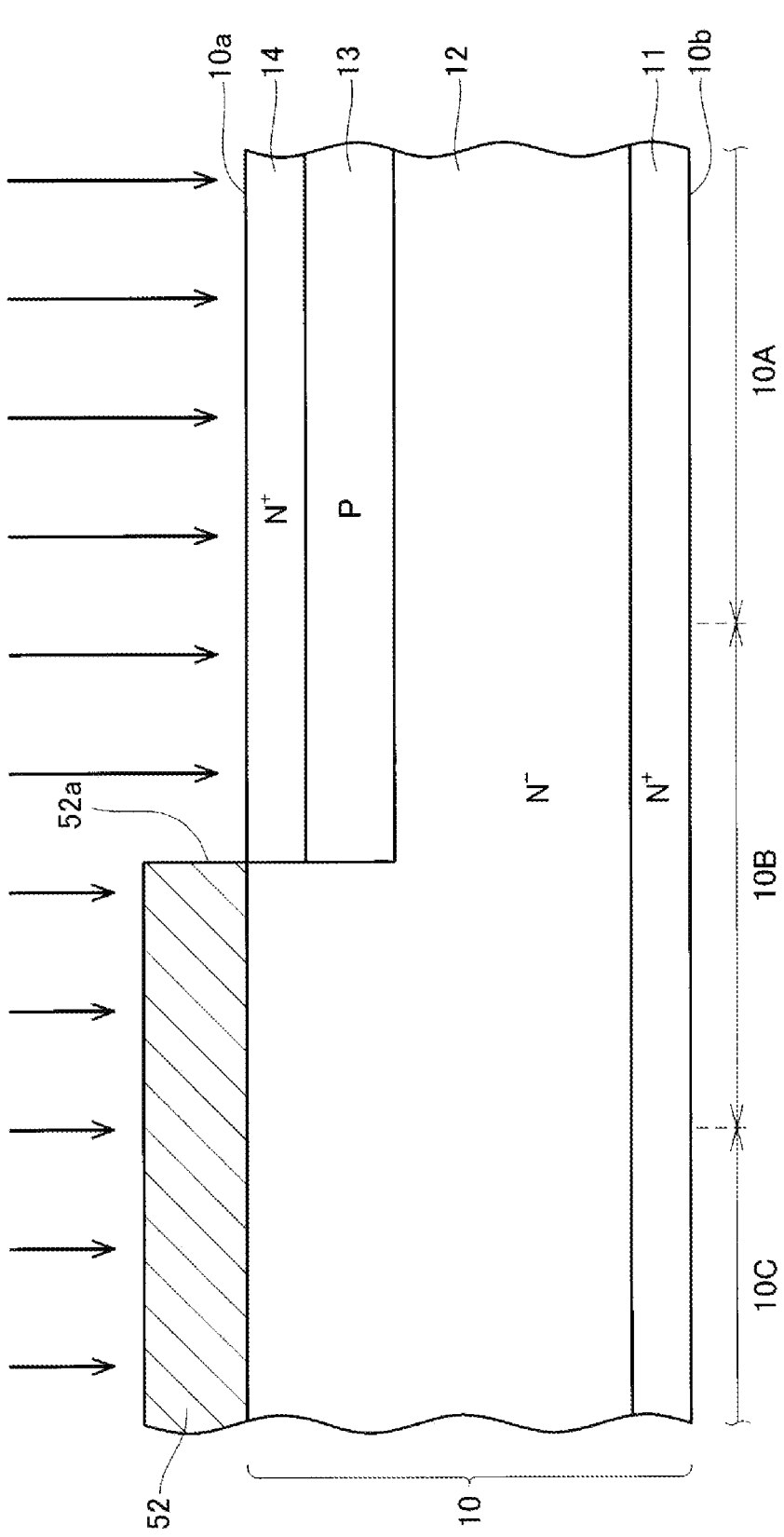
FIG. 7 is a diagram illustrating a cross-sectional view of the part of the semiconductor device in a process of manufacturing the semiconductor device subsequent to the process illustrated in FIG. 6.

Next, as shown in FIG. 7, nitrogen ions are implanted in multiple stages toward the upper surface 10a of the semiconductor layer 10 exposed from the opening 52a of the mask 52 by using an ion implantation technique to form the source region 14. This process is an example of the source region forming process. The source region 14 is formed so as to spread in the planar manner in the entire range of the active region 10A and the partial range of the intermediate region 10B of the semiconductor layer 10, and is formed in a range shallower than the body region 13 so as to be stacked on the body region 13. The source region 14 is formed at a position exposed on the upper surface 10a of the semiconductor layer 10. The source region 14 may be formed before the body region 13. The ion implantation process is not particularly limited. For example, the dose amount may be $1\times10^{13}$ to $1\times10^{16}$ $cm^{-2}$ and the implantation energy may be 10 to 500 eV. Although the source region 14 is not particularly limited, for example, a peak concentration of the n-type impurities may be $1\times10^{18}$ to $1\times10^{20}$ $cm^{-3}$ and a depth of the bottom surface may be 0.1 to 0.8 μm. After forming the body region 13 and the source region 14, the mask 52 is removed.

Figure 8:
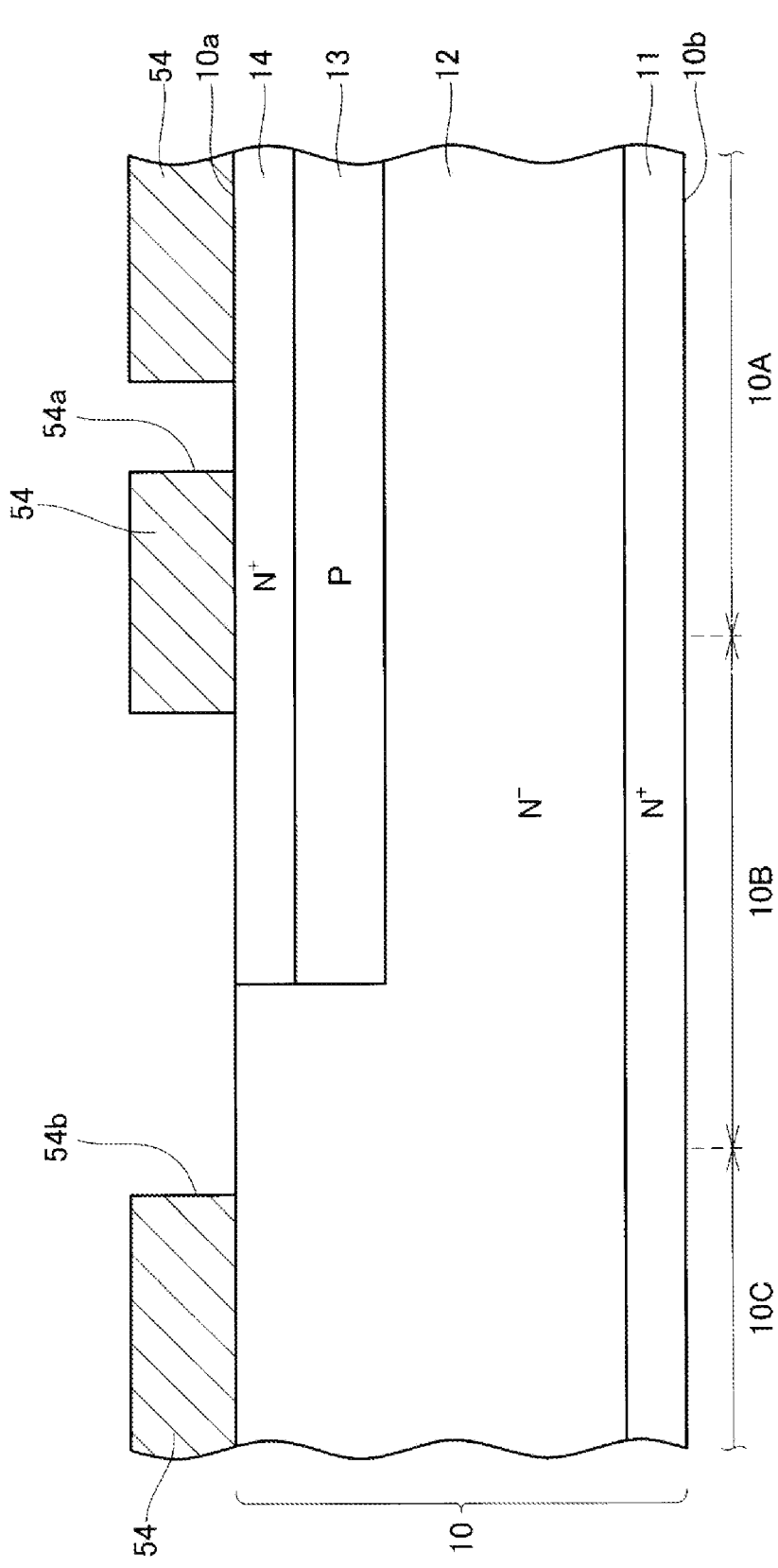
FIG. 8 is a diagram illustrating a cross-sectional view of the part of the semiconductor device in a process of manufacturing the semiconductor device subsequent to the process illustrated in FIG. 7.

Next, as shown in FIG. 8, a mask 54 is deposited on the upper surface 10a of the semiconductor layer 10 by using a CVD technique and a photolithography technique. This process is an example of a second mask deposition process. The mask 54 has an inner peripheral opening 54a corresponding to a partial range of the active region 10A and an outer peripheral opening 54b corresponding to a partial range of the intermediate region 10B. The outer peripheral opening 54b of the mask 54 is formed around the source region 14 along a peripheral edge of the source region 14 so that the peripheral edge of the source region 14 is exposed.

Figure 9:
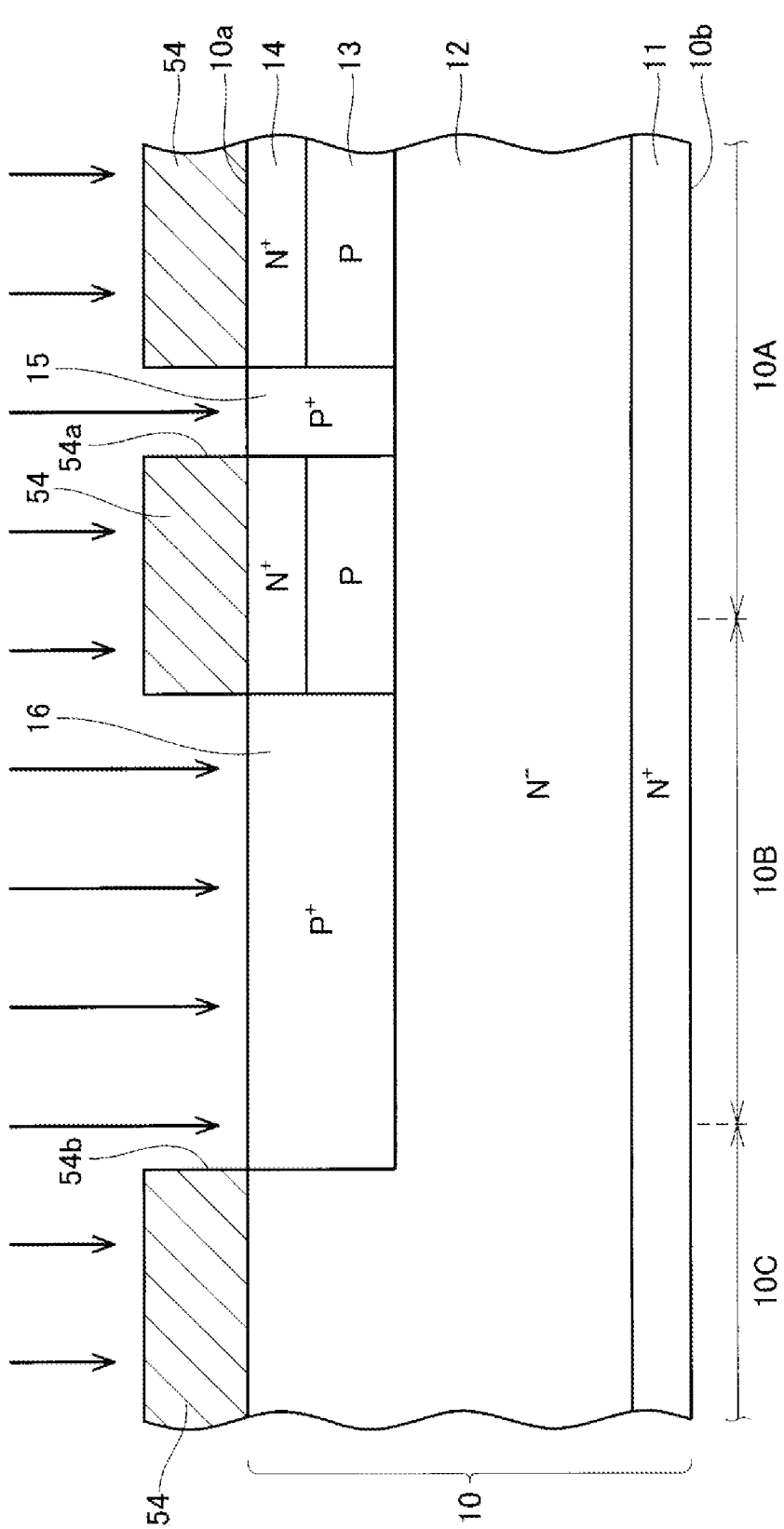
FIG. 9 is a diagram illustrating a cross-sectional view of the part of the semiconductor device in a process of manufacturing the semiconductor device subsequent to the process illustrated in FIG. 8.

Next, as shown in FIG. 9, aluminum ions are implanted in multiple stages toward the upper surface 10a of the semiconductor layer 10 exposed through the inner peripheral opening 54a and the outer peripheral opening 54b of the mask 54 using an ion implantation technique to form the first contact region 15 and the second contact region 16. This process is an example of a contact region forming process. The ion implantation process is not particularly limited. For example, the dose amount may be $1\times10^{13}$ to $1\times10^{16}$ $cm^{-2}$ and the implantation energy may be 10 to 1500 eV. Although the first contact region 15 and the second contact region 16 are not particularly limited, for example, a peak concentration of the p-type impurities may be $1\times10^{19}$ to $1\times10^{21}$ $cm^{-3}$, and a depth of bottom surfaces may be 0.5 to 1.5 μm. After forming the first contact region 15 and the second contact region 16, the mask 54 is removed.

The first contact region 15 and the second contact region 16 are formed so as to reach the body region 13 beyond the source region 14. Accordingly, the first contact region 15 is electrically connected to the body region 13 in the active region 10A. The second contact region 16 is electrically connected to the body region 13 in the intermediate region 10B. Furthermore, the first contact region 15 and the second contact region 16 are formed so that the depths of the bottom surfaces thereof are substantially equal to the depth of the bottom surface of the body region 13. For example, in a case where the first contact region 15 and the second contact region 16 are formed such that the bottom surfaces of the first contact region 15 and the second contact region 16 are shallower than the bottom surface of the body region 13, in the intermediate region 10B, a corner portion corresponding to a peripheral end portion of the body region 13 is exposed to the drift region 12. Therefore, there is a concern about electric field concentration in the corner portion. On the other hand, in a case where the first contact region 15 and the second contact region 16 are formed so that the bottom surfaces of the first contact region 15 and the second contact region 16 match with the bottom surface of the body region 13, the corner portion corresponding to the peripheral portion of the body region 13 is not exposed to the drift region 12. Therefore, the electric field concentration in the corner portion is relaxed.

Figure 10:
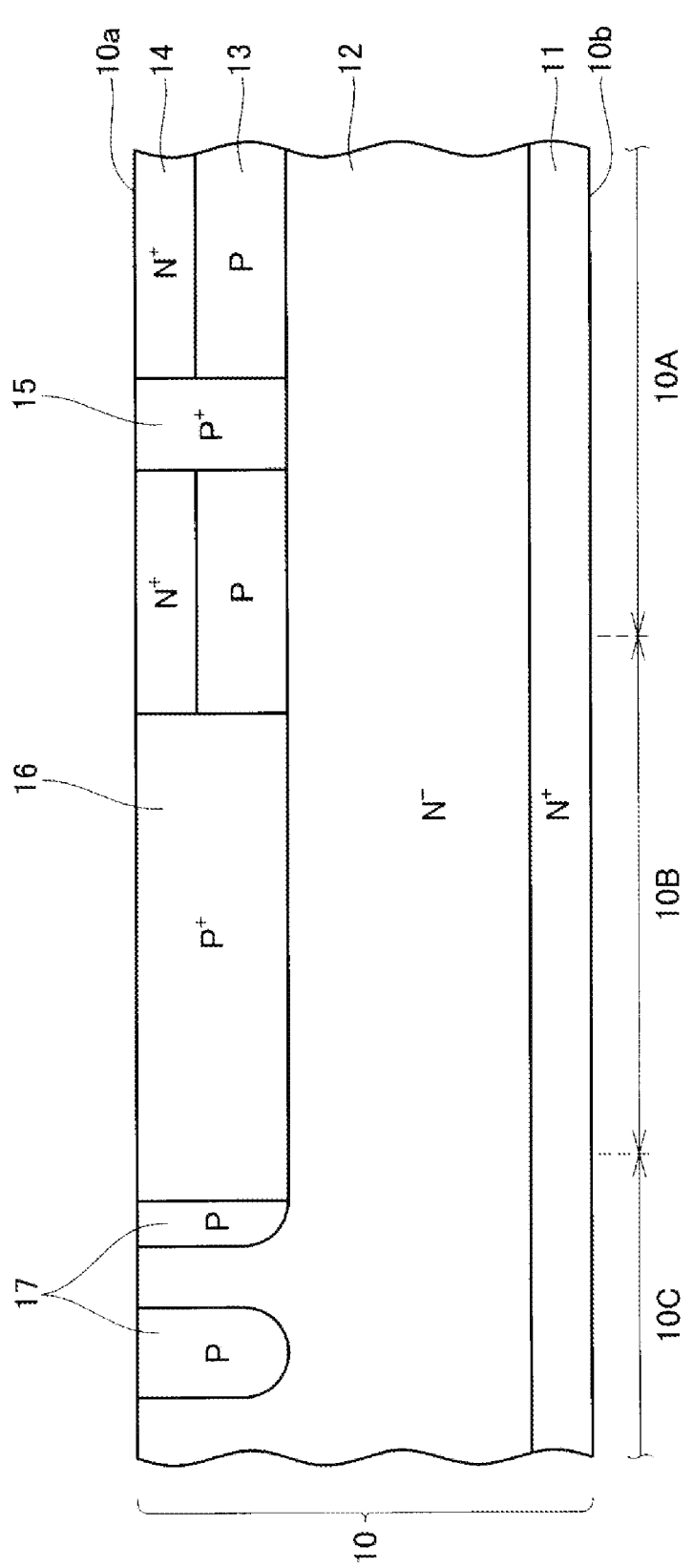
FIG. 10 is a diagram illustrating a cross-sectional view of the part of the semiconductor device in a process of manufacturing the semiconductor device subsequent to the process illustrated in FIG. 9.

Next, as shown in FIG. 10, the guard rings 17 are formed in the outer peripheral region 10C using an ion implantation technique. Specifically, after a mask having openings at positions corresponding to formation positions of the guard rings 17 is deposited on the upper surface 10a of the semiconductor layer 10, aluminum ions are implanted through the openings of the mask. Accordingly, the guard rings 17 can be formed. The guard rings 17 may be formed simultaneously with the body region 13. In this case, the plurality of guard rings 17 can be formed simultaneously with the body region 13 by forming openings corresponding to the plurality of guard rings 17 in the mask 52 for forming the body region 13.

Figure 11:
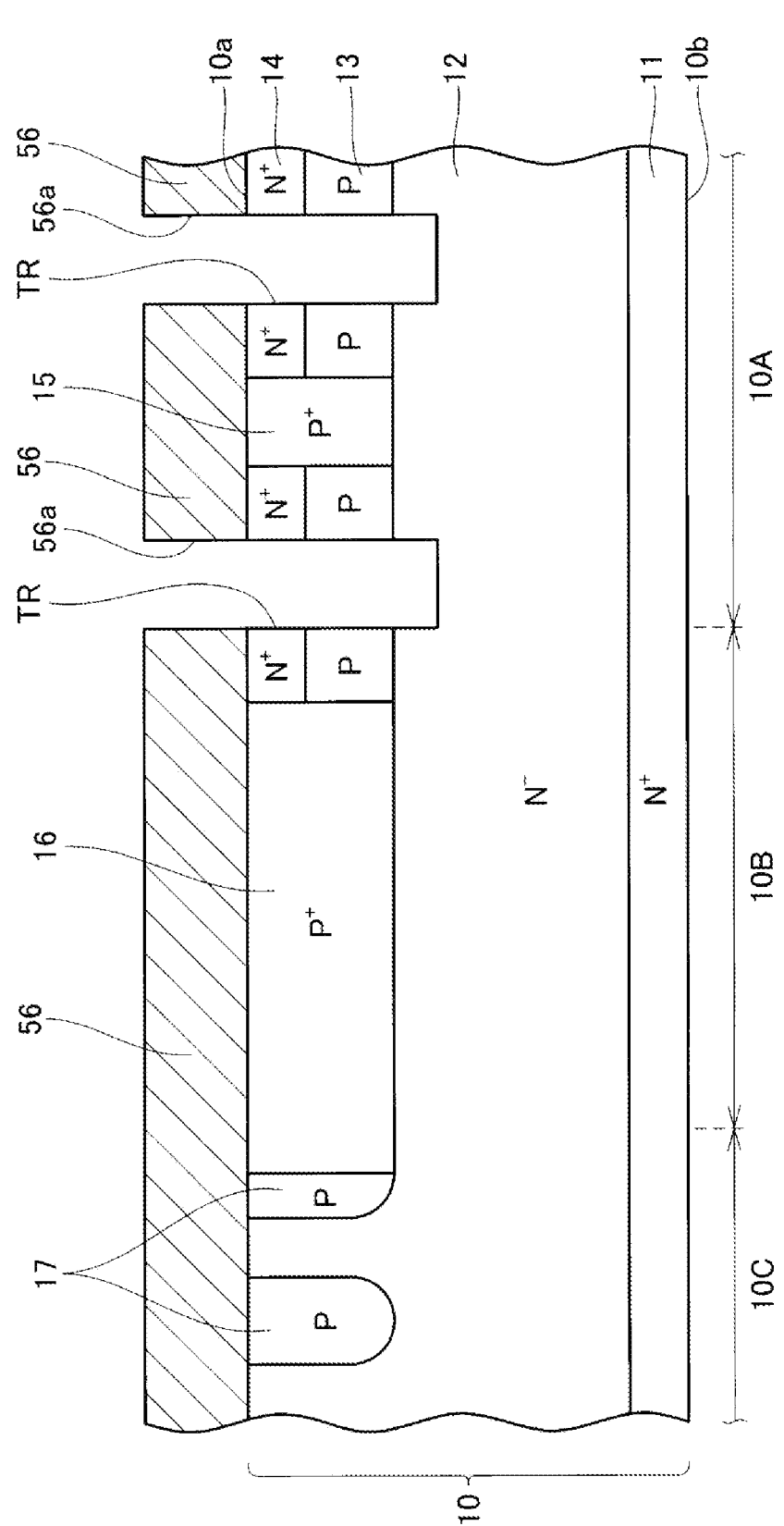
FIG. 11 is a diagram illustrating a cross-sectional view of the part of the semiconductor device in a process of manufacturing the semiconductor device subsequent to the process illustrated in FIG. 10.

Next, as shown in FIG. 11, a mask 56 is formed on the upper surface 10a of the semiconductor layer 10 by using a CVD technique and a photolithography technique. The mask 56 has a plurality of openings 56a corresponding to a partial range of the active region 10A. Next, trenches TR are formed in a surface layer portion of the semiconductor layer 10 exposed through the openings 56a of the mask 56 by using a dry etching technique. The trenches TR are formed from the upper surface 10a of the semiconductor layer 10 to penetrate the source region 14 and the body region 13 and reach the drift region 12. Although not particularly limited, the trenches TR may have a depth of 0.5 to 2 μm and a width in the lateral direction of 0.3 to 1 μm, for example. After the trenches TR are formed, the mask 56 is removed. After the mask 56 is removed, a protective film is formed to cover the surface of the semiconductor layer 10 and inner surfaces of the trenches TR, and an activation annealing is performed. Thereafter, the protective film is removed.

Figure 12:
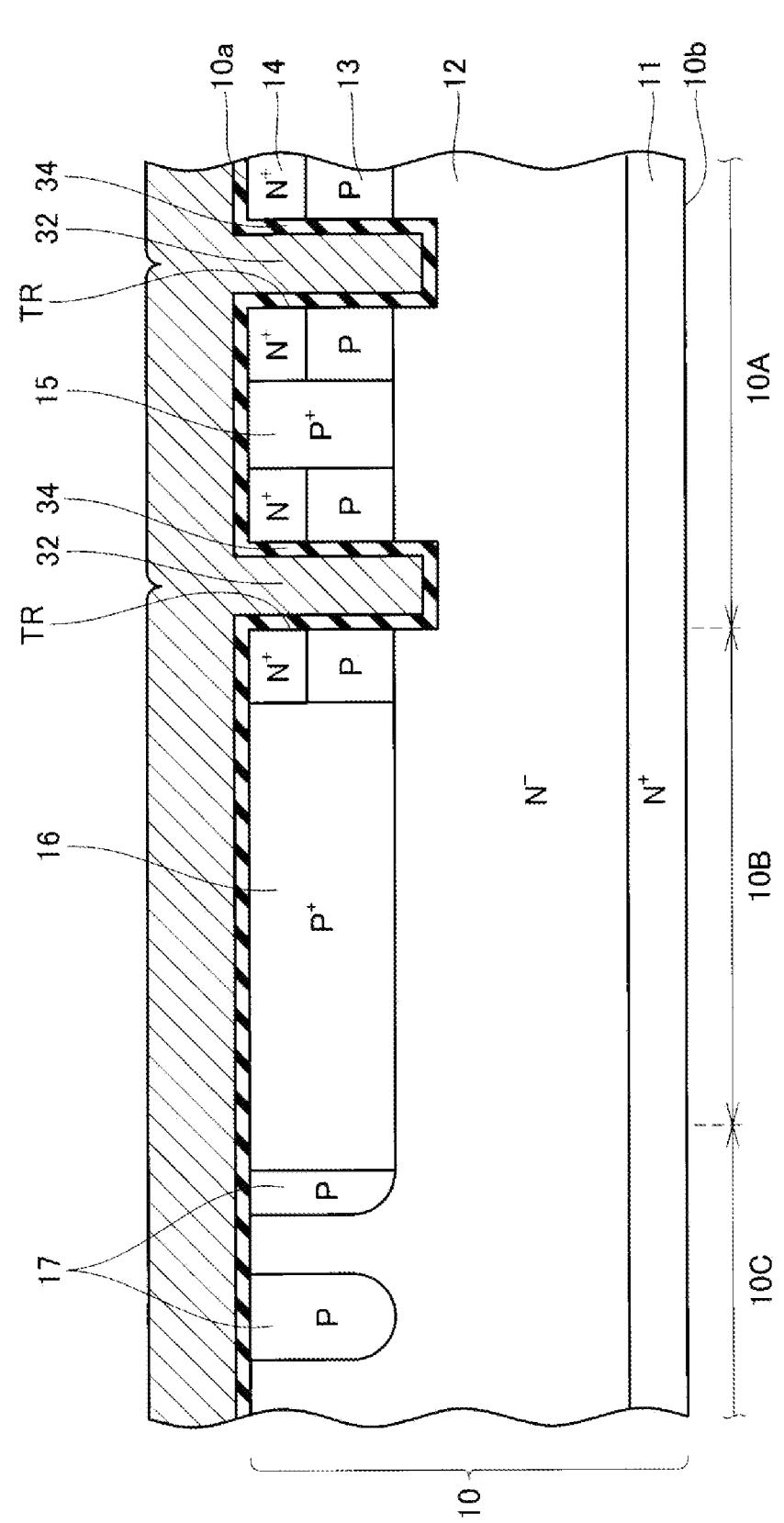
FIG. 12 is a diagram illustrating a cross-sectional view of the part of the semiconductor device in a process of manufacturing the semiconductor device subsequent to the process illustrated in FIG. 11.

Next, as shown in FIG. 12, the gate insulating film 34 is formed so as to cover the upper surface 10a of the semiconductor layer 10 and the inner surfaces of the trenches TR by using a CVD technique. Next, the gate electrode 32 is formed to fill the trenches TR by using a CVD technique.

Figure 13:
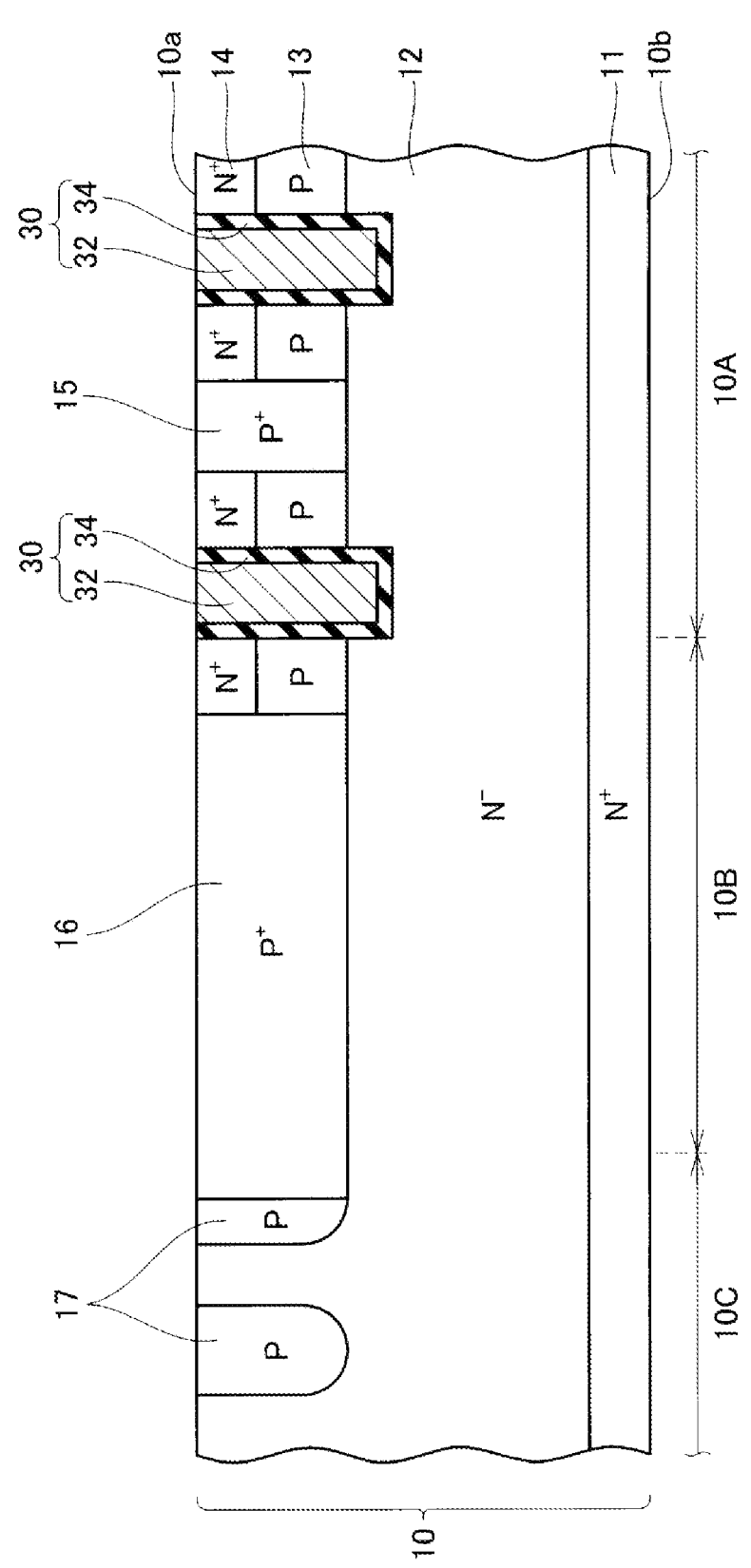
FIG. 13 is a diagram illustrating a cross-sectional view of the part of the semiconductor device in a process of manufacturing the semiconductor device subsequent to the process illustrated in FIG. 12.

Next, as shown in FIG. 13, the gate insulating film 34 and the gate electrode 32 formed on the upper surface 10a of the semiconductor layer 10 are removed. Note that a part of the gate electrode 32 formed on the upper surface 10a of the semiconductor layer 10 is not illustrated in this cross section, but may be left to be used as a gate wiring.

Figure 14:
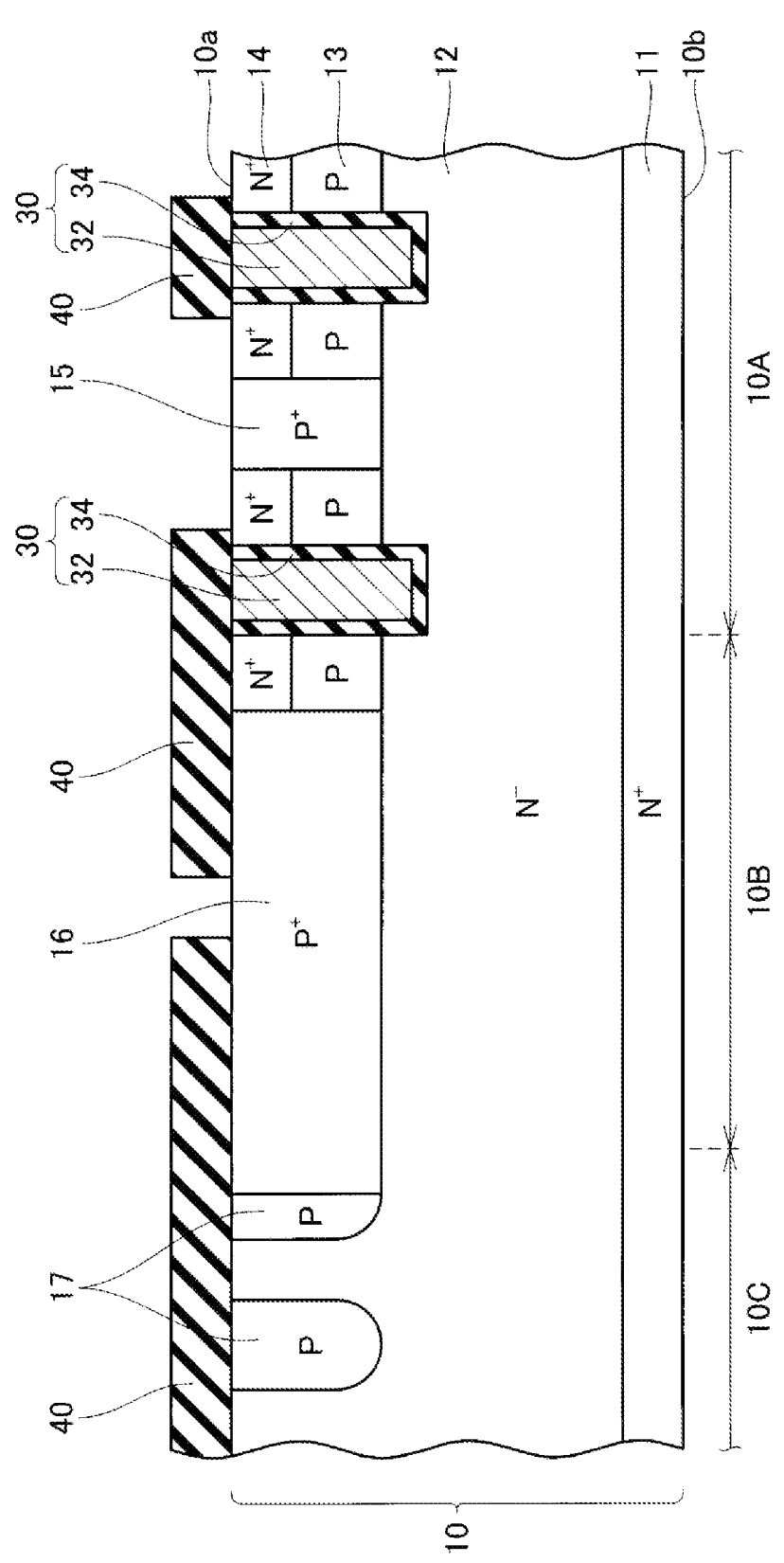
FIG. 14 is a diagram illustrating a cross-sectional view of the part of the semiconductor device in a process of manufacturing the semiconductor device subsequent to the process illustrated in FIG. 13.

Next, as shown in FIG. 14, the interlayer insulating film 40 is formed on the upper surface 10a of the semiconductor layer 10 by using a CVD technique and a photolithography technique. The interlayer insulating film 40 is formed to have openings through which the source region 14 and the first contact region 15 in the active region 10A are exposed and an opening through which the second contact region 16 in the intermediate region 10B is exposed. Next, a metal film for forming a silicide layer is formed on the upper surface 10a of the semiconductor layer 10 exposed through the openings of the interlayer insulating film 40. The metal film is not particularly limited, and may be, for example, a metal film in which nickel (Ni), cobalt (Co), and titanium (Ti) are stacked. After the metal film is formed, an annealing process is performed to form the silicide layer. After the annealing process is performed, an unreacted metal is removed. Next, the drain electrode 22, the source electrode 24, and the gate pad GP (see FIG. 1) are deposited to complete the semiconductor device 1.

In this manufacturing method, the body region 13 and the source region 14 are formed using the common mask 52. Therefore, in this manufacturing method, a mask film forming process can be reduced, so that the semiconductor device 1 can be manufactured at low cost.

On the other hand, when the body region 13 and the source region 14 are formed by using the common mask 52, the body region 13 and the source region 14 are formed to spread in the planar manner to an outer side than the trench gates 30, that is, in the intermediate region 10B. The body region 13 is formed with a relatively low impurity concentration in consideration of a gate threshold voltage and a channel resistance. Thus, when the body region 13 spreading in the planar manner is present in the intermediate region 10B, the potential may become unstable depending on the area thereof. In particular, in the semiconductor layer 10 made of silicon carbide, a resistance of a p-type region is high. Therefore, the potential is likely to be unstable in the body region 13 spreading in the planar manner to the intermediate region 10B.

In this manufacturing method, since the second contact region 16 is provided in the intermediate region 10B, the potential of the body region 13 located in the intermediate region 10B is stabilized. In particular, since the bottom surface of the second contact region 16 is formed to have substantially the same depth as the bottom surface of the body region 13, the body region 13 overlaps with the second contact region 16. Therefore, since the body region 13 of the intermediate region 10B is overlapped with the second contact region 16 having a high impurity concentration, the impurity concentration is substantially increased, and the potential of the portion is stabilized.

In addition, the second contact region 16 is provided over a wide range in the intermediate region 10B such that the inner end portion is in contact with the body region 13 and the source region 14, and the outer end portion is in contact with the innermost one of the guard rings 17. For example, the second contact region 16 occupies a half or more of the intermediate region 10B in a circumferential direction (a direction connecting the active region 10A and the outer peripheral region 10C). As a result, the areas of the body region 13 and the source region 14 present in the intermediate region 10B are reduced. The potential of the body region 13 is stabilized by reducing the area of the body region 13. In addition, the potential of the source region 14 present in the intermediate region 10B is floating, and the potential is unstable. However, since the area of the source region 14 is small, an issue such as a decrease in breakdown voltage due to the source region 14 having such an unstable potential is also restricted.

Furthermore, the second contact region 16 can be formed simultaneously with the first contact region 15 by using the mask 54. In this manufacturing method, the second contact region 16 can be formed simultaneously with the process of forming the first contact region 15 without increasing the number of processes dedicated to forming the second contact region 16.

Second Embodiment

Figure 15:
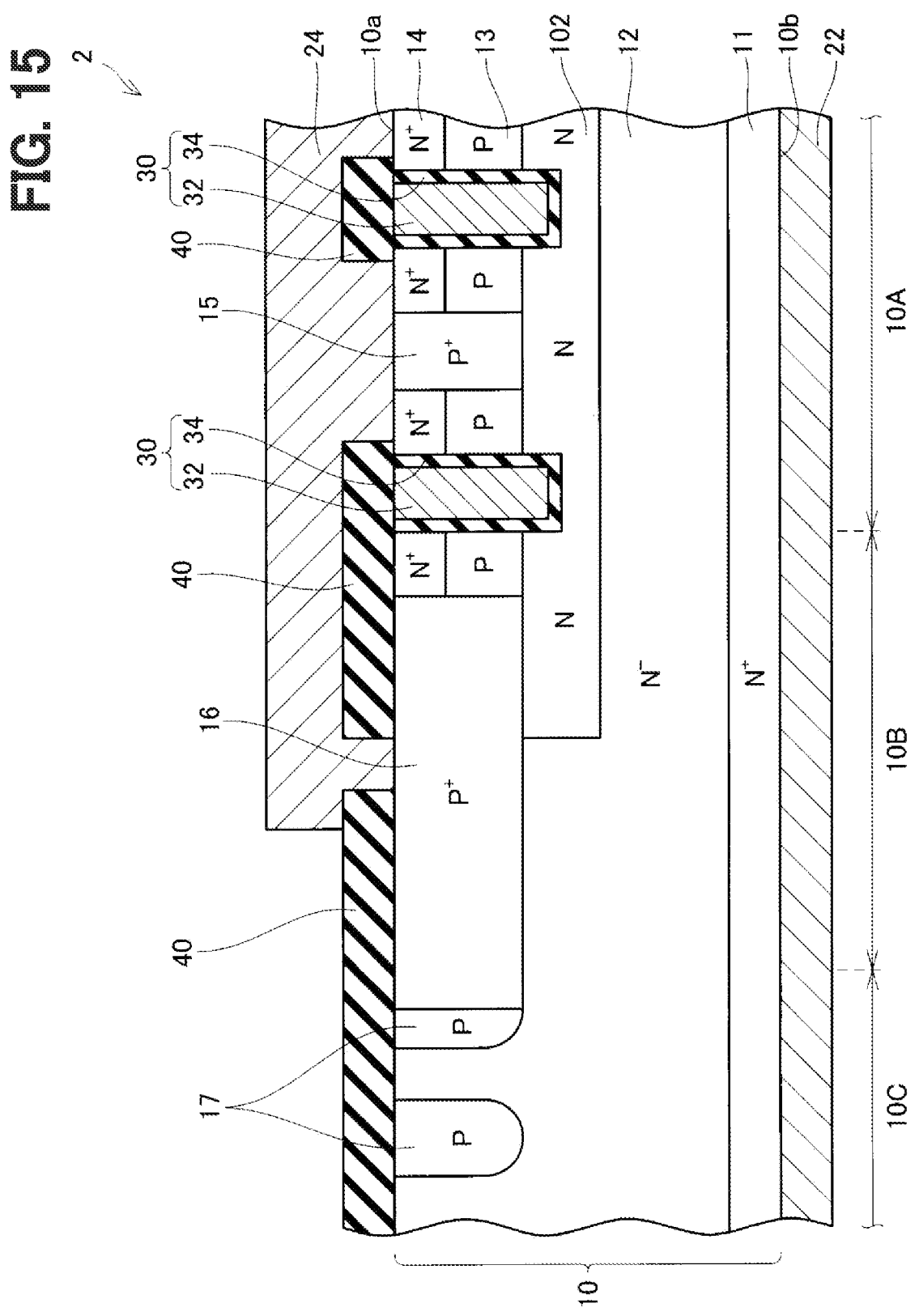
FIG. 15 is a diagram illustrating a cross-sectional view of a part of a semiconductor device of a second embodiment taken along a line corresponding to line II-II in FIG. 1.

FIG. 15 illustrates a semiconductor device 2 of a second embodiment. The same components as those of the semiconductor device 1 of the first embodiment are denoted by the same reference numerals, and the description thereof will be omitted. The semiconductor device 2 is characterized in that the semiconductor layer 10 has a current diffusion region 102.

The current diffusion region 102 is an n-type layer containing n-type impurities at a higher concentration than the drift region 12. The current diffusion region 102 is disposed over the entire range of the active region 10A and a partial range of the intermediate region 10B, is provided between the drift region 12 and the body region 13, and is in contact with both the drift region 12 and the body region 13. The current diffusion region 102 is formed to spread in a planar manner between the drift region 12 and the body region 13, and is in contact with a lower portion of the bottom surface and the side surface of each of the trench gates 30. The current diffusion region 102 can be formed using the common mask 52 in the ion implantation process described with reference to FIGS. 5 to 7. Therefore, the current diffusion region 102 can be formed without adding a process for forming a dedicated mask.

When the current diffusion region 102 is provided, a current can diffuse and flow in the drift region 12. Therefore, the semiconductor device 2 can have low on-resistance characteristics.

Third Embodiment

Figure 16:
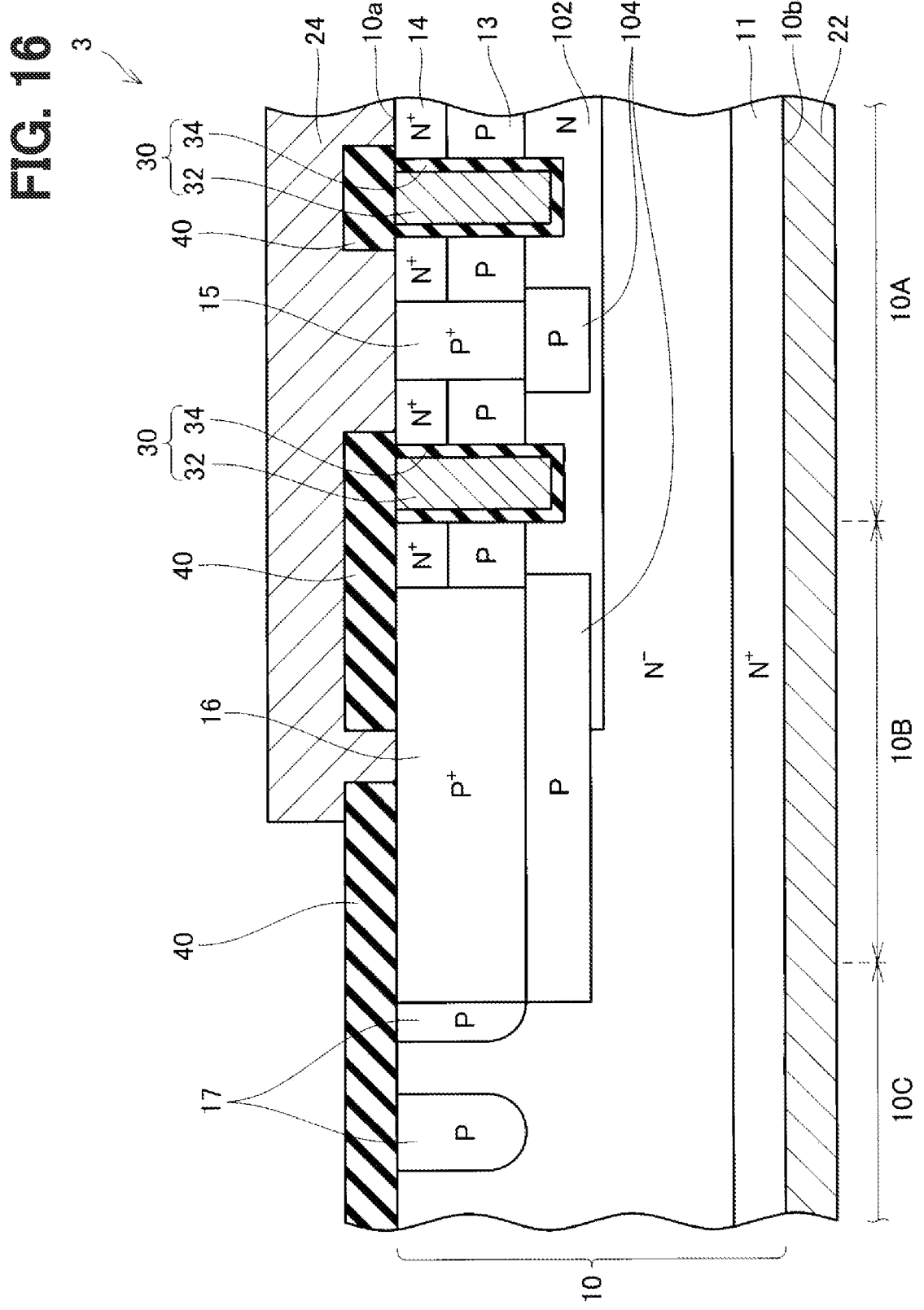
FIG. 16 is a diagram illustrating a cross-sectional view of a part of a semiconductor device of a third embodiment taken along a line corresponding to line II-II in FIG. 1.

FIG. 16 illustrates a semiconductor device 3 of a third embodiment. The same components as those of the semiconductor device 2 of the second embodiment are denoted by the same reference numerals, and the description thereof is omitted. The semiconductor device 3 is characterized in that the semiconductor layer 10 has a plurality of deep regions 104.

The deep regions 104 are a p-type layer containing p-type impurities. The deep region 104 are located in the active region 10A and the intermediate region 10B, and extend from the lower surface of the body region 13 to a position deeper than the bottom surfaces of the trench gates 30. The bottom surfaces of the deep regions 104 may be shallower than the bottom surface of the current diffusion region 102 or may be deeper than the bottom surface of the current diffusion region 102. The deep region 104 provided in the active region 10A is disposed below the first contact region 15, is in contact with the bottom surface of the first contact region 15, and extends along the first contact region 15, that is, in parallel with the longitudinal direction of the trench gates 30 when the semiconductor layer 10 is seen in plan view.

In FIG. 16, only one deep region 104 provided in the active region 10A is illustrated, but in practice, a plurality of deep regions 104 are provided in the active region 10A. Therefore, the plurality of deep regions 104 provided in the active region 10A extends along the longitudinal direction of the trench gates 30 when the semiconductor layer 10 is seen in plan view, and is arranged at an interval therebetween in a direction orthogonal to the longitudinal direction of the trench gates 30. The current diffusion region 102 is provided between the adjacent deep regions 104. The deep region 104 provided in the intermediate region 10B is disposed below the second contact region 16, is in contact with the bottom surface of the second contact region 16, and extends along the second contact region 16, that is, along the peripheral edge of the body region 13 and the source region 14 when the semiconductor layer 10 is seen in plan view. The deep regions 104 can be formed using, for example, an ion implantation technique. In this case, the guard rings 17 may be simultaneously formed when the deep regions 104 are formed. Specifically, after a mask having openings at positions corresponding to the formation positions of the deep regions 104 and the guard rings 17 is formed on the upper surface 10a of the semiconductor layer 10, p-type impurity ions are implanted through the openings of the mask by using an ion implantation technique. Accordingly, the deep regions 104 and the guard rings 17 can be simultaneously formed. The guard rings 17 formed in this manner are disposed at the same depth as the deep regions 104, that is, inside the semiconductor layer 10. When the guard rings 17 and the deep regions 104 are formed simultaneously, a mask and a process necessary for forming the guard rings 17 and the deep regions 104 can be shared, so that the semiconductor device 3 can be manufactured at low cost.

When the deep regions 104 are provided, an electric field concentration applied to the gate insulating film 34 of each of the trench gates 30 is relaxed.

Therefore, the semiconductor device 3 can have high breakdown voltage characteristics.

Figure 17:
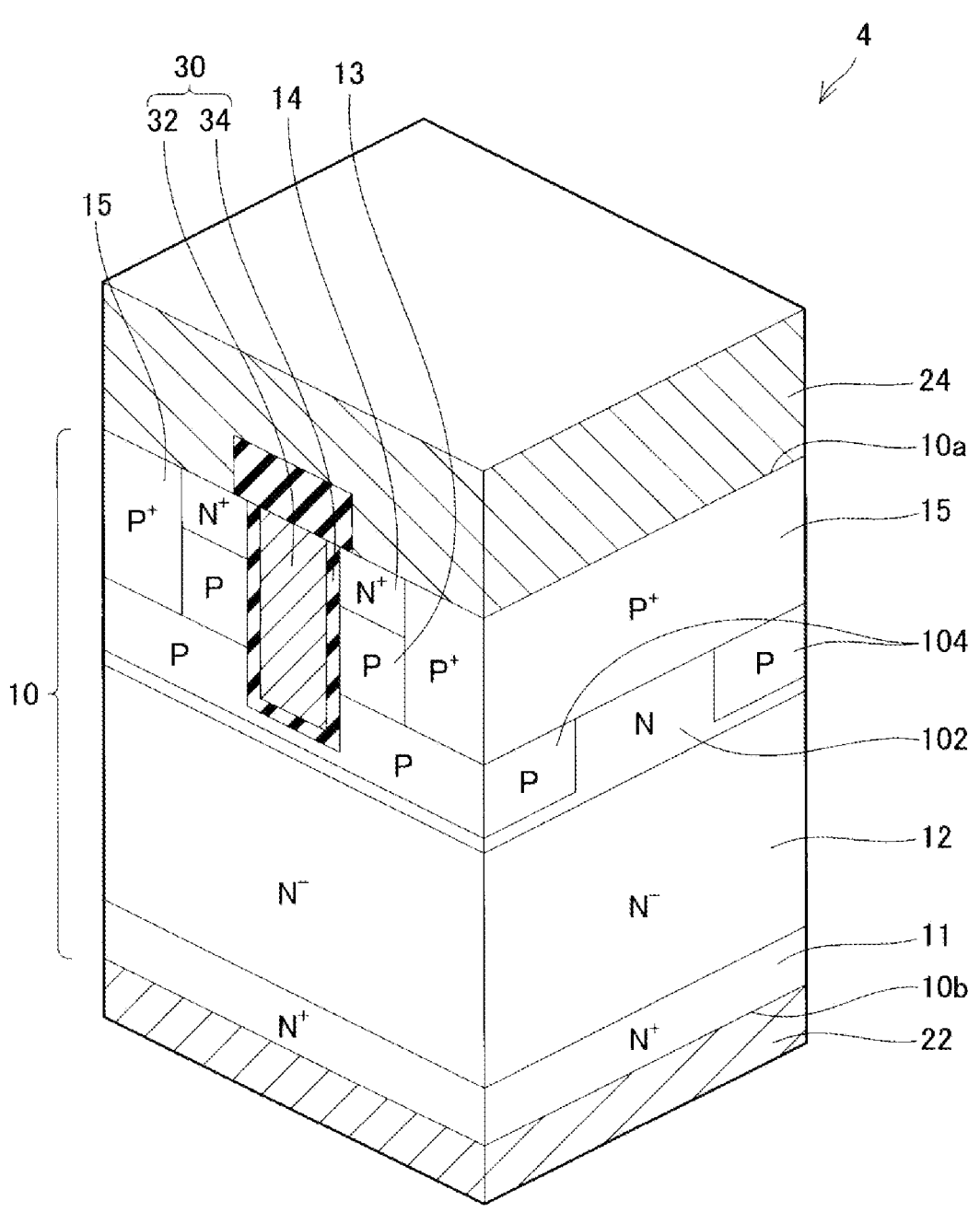
FIG. 17 is a perspective view of a part of a semiconductor device according to a first modification of the third embodiment.

In the semiconductor device 3, the deep regions 104 provided in the active region 10A extend parallel to the longitudinal direction of the trench gates 30 when the semiconductor layer 10 is seen in plan view. Instead of this example, as in a semiconductor device 4 illustrated in FIG. 17, the deep regions 104 provided in the active region 10A may extend across the trench gates 30.

Figure 18:
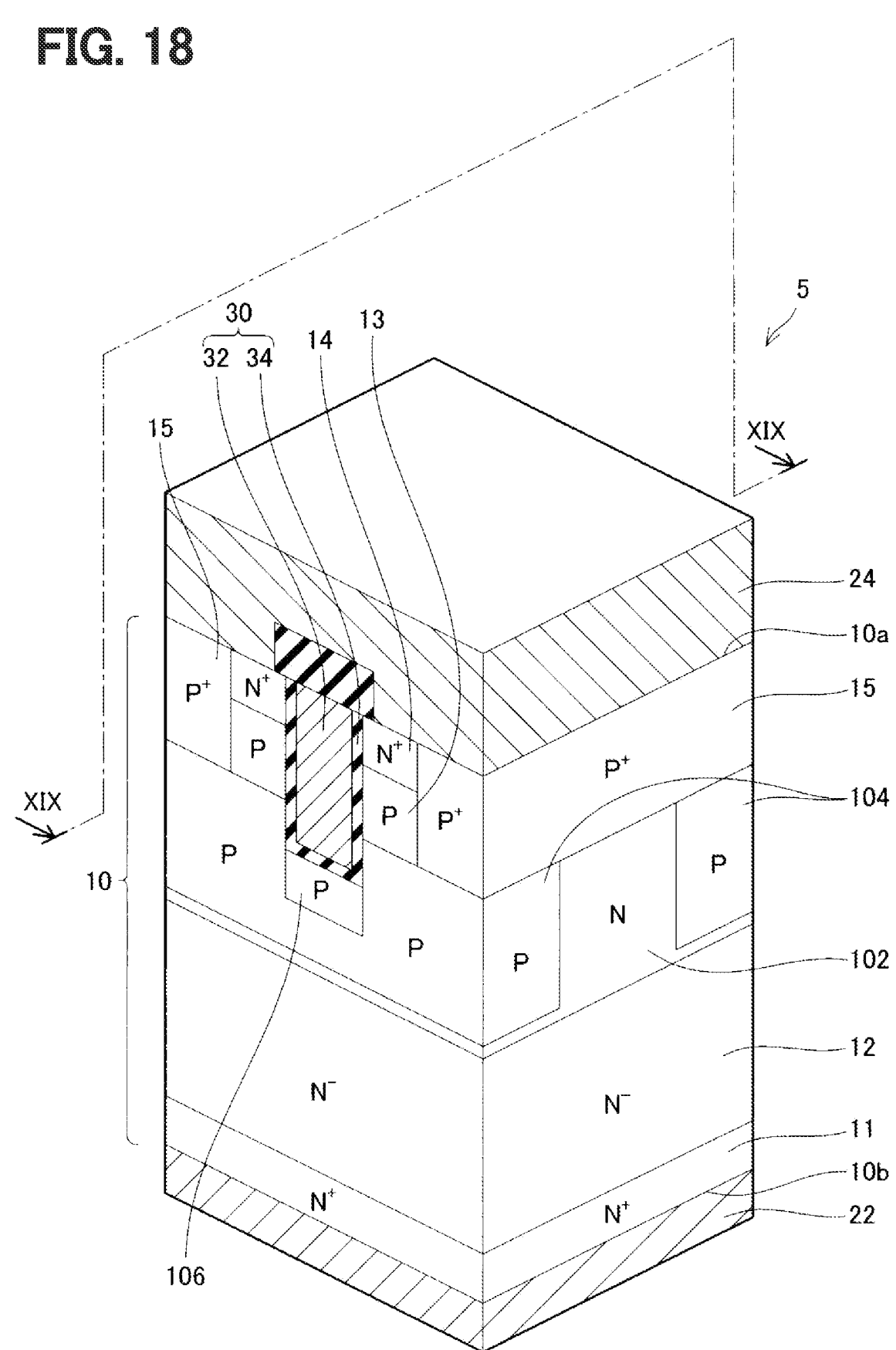
FIG. 18 is a perspective view of a part of a semiconductor device according to a second modification of the third embodiment.
Figure 19:
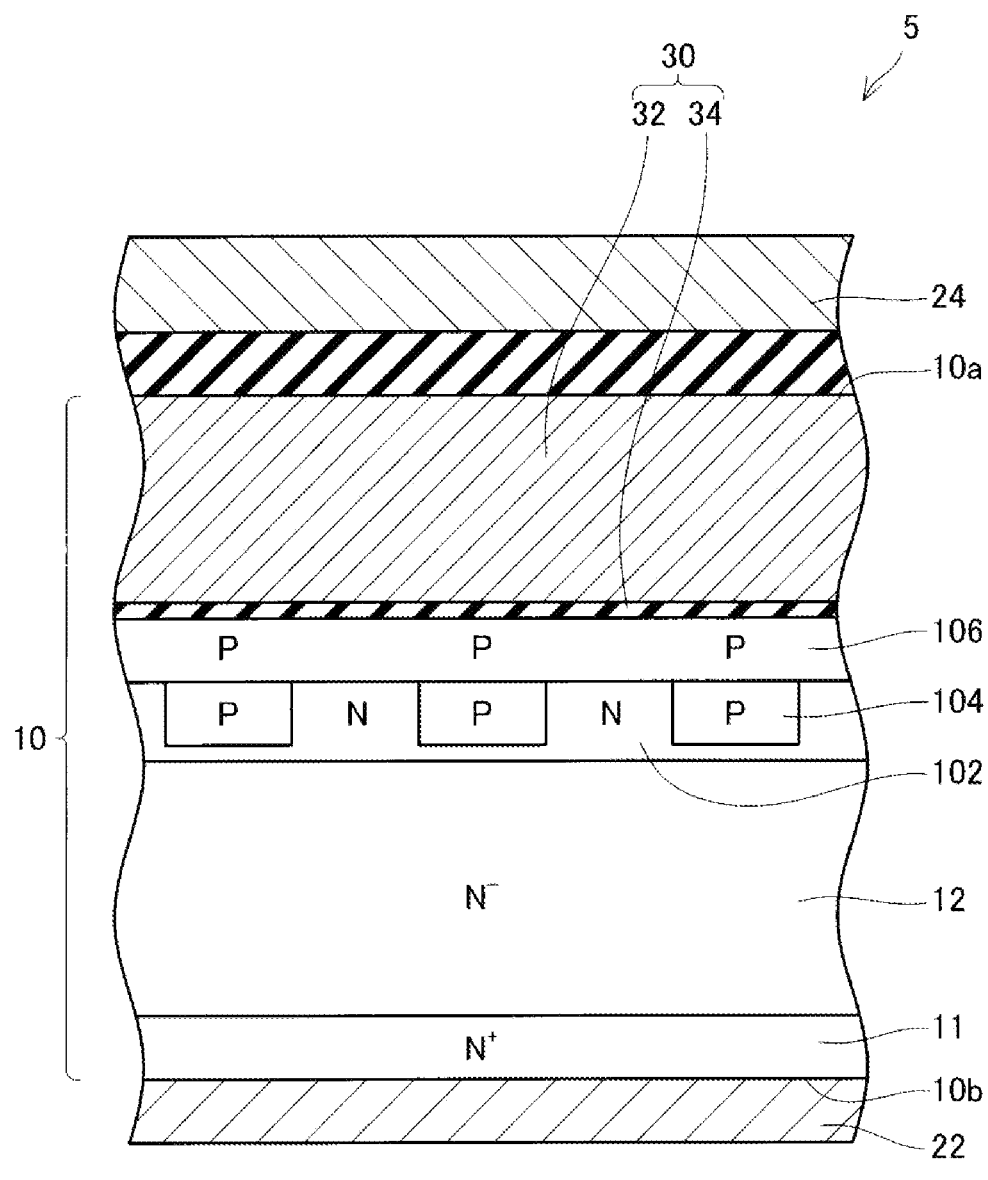
FIG. 19 is a cross-sectional view of the part of the semiconductor device according to the second modification of the third embodiment taken along line XIX-XIX in FIG. 18.

As in a semiconductor device 5 illustrated in FIG. 18 and FIG. 19, the semiconductor layer 10 may further include an electric field relaxation region 106 in contact with the bottom surface of each of the trench gates 30. The electric field relaxation region 106 is a p-type layer containing p-type impurities. The electric field relaxation region 106 is provided along the longitudinal direction of the trench gate 30, and extends from one end to the other end of the trench gate 30 in plan view of the semiconductor layer 10. The electric field relaxation region 106 is in contact with the gate insulating film 34 covering the bottom surface of the trench 14. The electric field relaxation region 106 is formed shallower than the deep regions 104. Instead of this example, the electric field relaxation region 106 may be formed deeper than the deep regions 104. The electric field relaxation region 106 is electrically connected to the body region 13 via the deep regions 104.

When the electric field relaxation region 106 is provided, an electric field concentration applied to the gate insulating film 34 of the trench gate 30 is relaxed.

Therefore, the semiconductor device 5 can have high breakdown voltage characteristics. In addition, when the electric field relaxation region 106 is provided, an area in which the trench gate 30 and the current diffusion region 102 are in contact with each other is reduced, so that a feedback capacitance (a gate-drain capacitance) is reduced.

Figure 20:
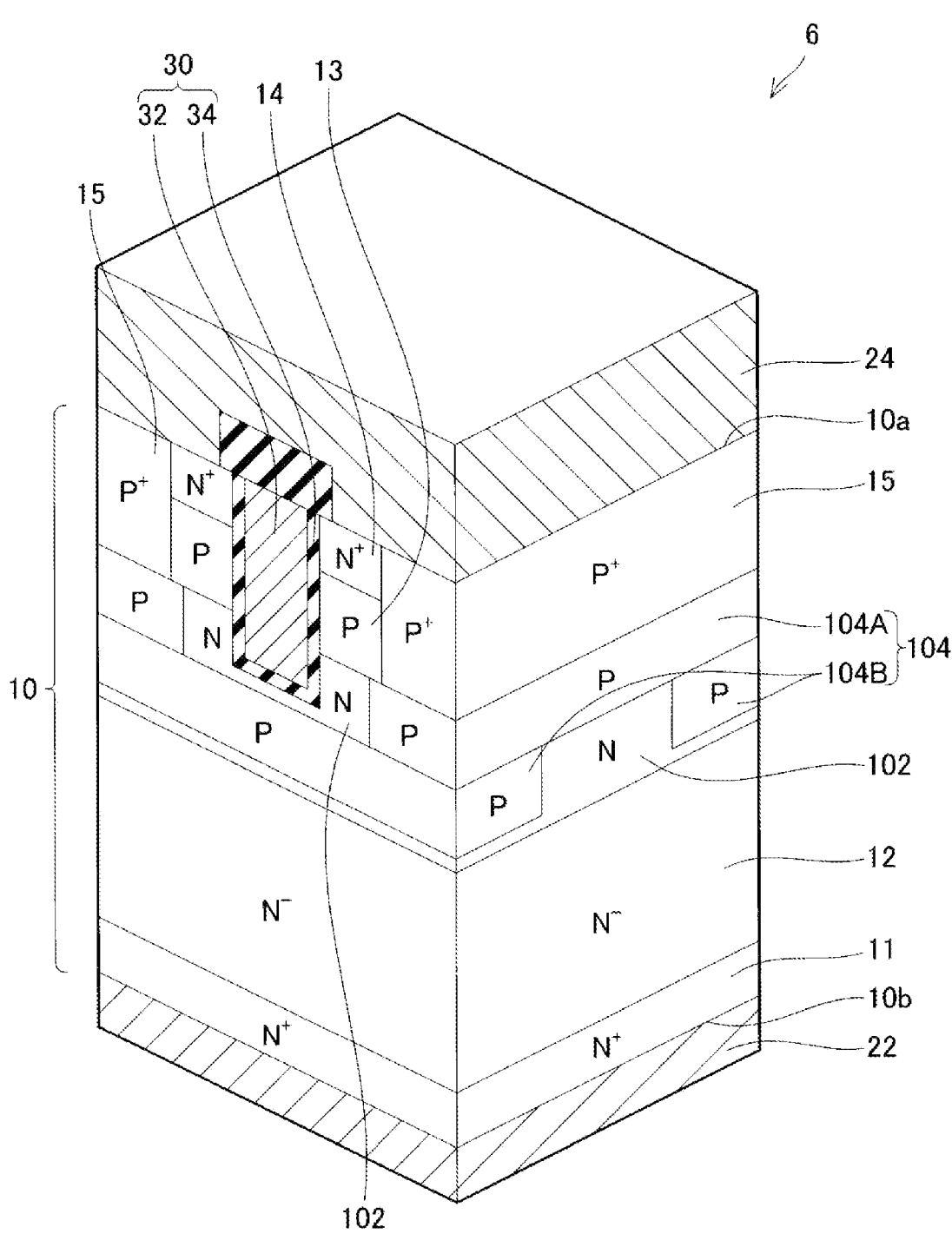
FIG. 20 is a perspective view of a part of a semiconductor device according to a third modification of the third embodiment.

As in a semiconductor device 6 illustrated in FIG. 20, the plurality of deep regions 104 provided in the active region 10A may include a plurality of upper deep regions 104A extending parallel to the longitudinal direction of the trench gates 30 and a plurality of lower deep regions 104 arranged below the plurality of upper deep regions 104A and extending across the trench gates 30. Each of the upper deep regions 104A extends from the bottom surface of the body region 13 beyond the bottom surface of each of the trench gates 30. Each of the upper deep regions 104A is disposed below the first contact region 15 and is in contact with the bottom surface of the first contact region 15. The current diffusion region 102 is provided between the adjacent upper deep regions 104A. Each of the lower deep regions 104B is in contact with the bottom surfaces of the upper deep regions 104A. The current diffusion region 102 is provided between the adjacent lower deep regions 104B. The bottom surface of each of the lower deep regions 104 may be shallower than the bottom surface of the current diffusion region 102 or may be deeper than the bottom surface of the current diffusion region 102. Although not illustrated, in the semiconductor device 6, both the upper deep region 104A and the lower deep region 104B are provided below the second contact region 16 in the intermediate region 10B.

When the deep regions 104 have the above-described configuration, an electric field concentration applied to the gate insulating film 34 of each of the trench gates 30 is further relaxed. Therefore, the semiconductor device 6 can have higher breakdown voltage characteristics.

Fourth Embodiment

Figure 21:
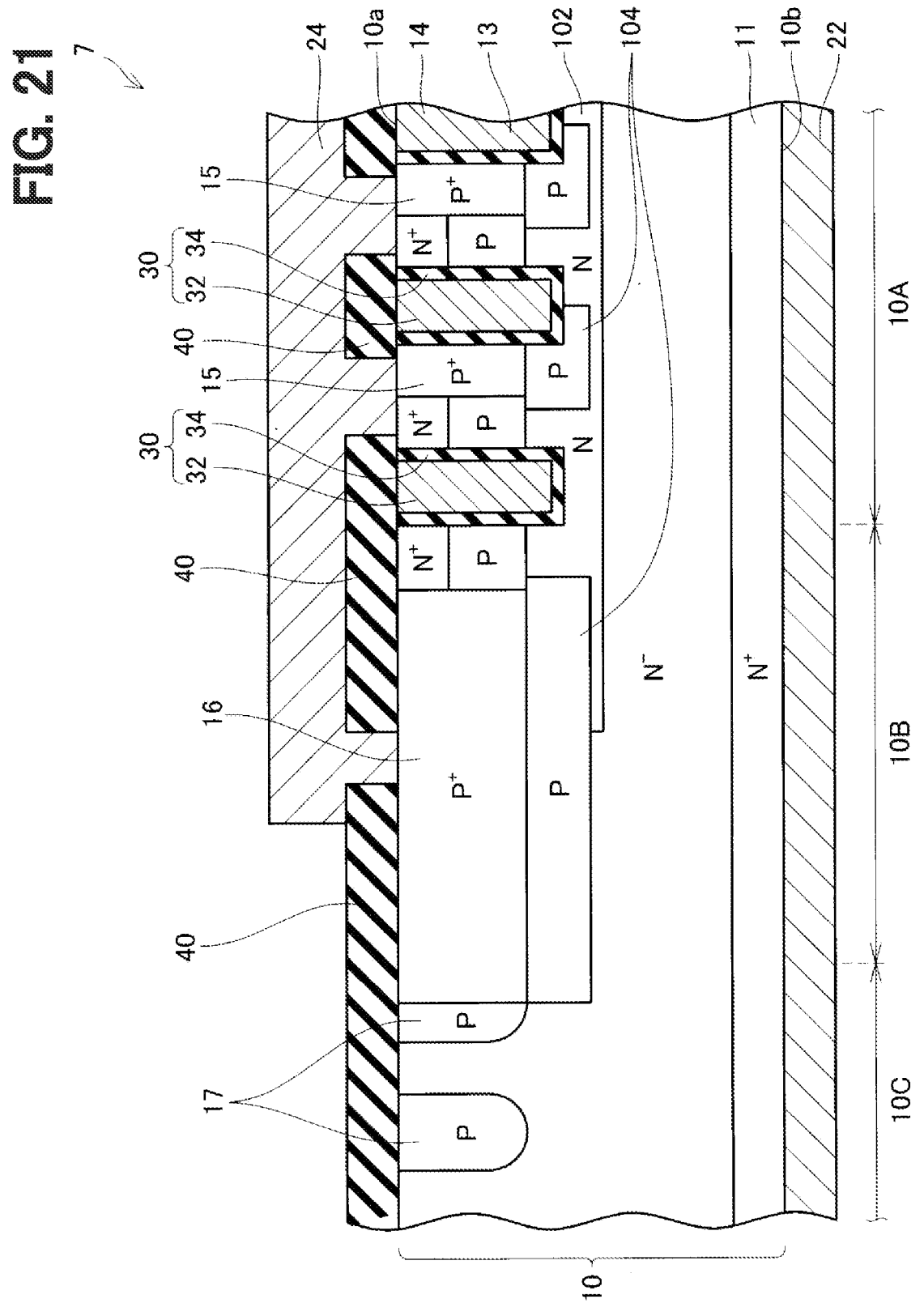
FIG. 21 is a diagram illustrating a cross-sectional view of a part of a semiconductor device of a fourth embodiment taken along a line corresponding to line II-II in FIG. 1.

FIG. 21 illustrates a semiconductor device 7 according to a fourth embodiment. The same components as those of the semiconductor device 3 of the third embodiment are denoted by the same reference numerals, and the description thereof is omitted. The semiconductor device 7 is characterized in that the first contact region 15 and the deep region 104 are provided so as to cover one side surface of each of the trench gates 30.

The first contact region 15 is in contact with an upper portion of the side surface of each of the trench gates 30. The deep region 104 is in contact with a lower portion of the side surface and a portion of the bottom surface of each of the trench gates 30. As described above, since the first contact region 15 and the deep region 104 are provided so as to be in contact with each of the trench gates 30, an electric field concentration applied to the gate insulating film 34 is favorably relaxed. On the other hand, in the semiconductor device 7, one side surface of each of the trench gates 30 does not function as a channel. However, by arranging one side surface of each of the trench gates 30 so as to overlap with the first contact region 15 and the deep region 104, the pitch of the trench gates 30 can be narrowed, and the channel area is secured. Therefore, in the semiconductor device 7, the electric field concentration applied to the gate insulating film 34 can be favorably relaxed while restricting a decrease in the on-resistance.

The features of the techniques disclosed in the present disclosure are summarized below. It should be noted that the technical elements described below are independent technical elements and exhibit technical usefulness alone or in various combinations, and are not limited to the combinations described in the claims at the time of filing.

An example of a semiconductor device disclosed in the present specification can include a semiconductor layer having a first main surface and a second main surface, and a trench gate. The semiconductor layer is divided into an active region, an outer peripheral region, and an intermediate region. The outer peripheral region extends around a periphery of the active region. The intermediate region is located between the active region and the outer peripheral region and extends around the periphery of the active region. The active region is a region in which the trench gate is disposed and a switching structure for controlling on and off of a current is formed. The outer peripheral region is a region in which an outer peripheral high breakdown voltage structure is formed. The outer peripheral high breakdown voltage structure is configured to extend a depletion layer from the active region toward an outer periphery when the semiconductor device is turned off. The outer peripheral high breakdown voltage structure is not particularly limited, but may be, for example, a guard ring. The intermediate region is a region between an outermost peripheral end portion of the trench gate located in the active region and an innermost peripheral end portion of the outer peripheral high breakdown voltage structure located in the outer peripheral region. The semiconductor layer may include a drift region of a first conductivity type, a body region of a second conductivity type, a source region of the first conductivity type, a first contact region of the second conductivity type, and a second contact region of the second conductivity type. The drift region is located in the active region, the intermediate region, and the outer peripheral region. The body region is located in the active region and the intermediate region, and is disposed above the drift region. The body region may be located in an entire range of the active region and a partial range of the intermediate region. The body region may be disposed on the drift region so as to be in contact with the drift region, or may be disposed above the drift region with another region interposed therebetween. The source region is located in the active region and the intermediate region, and is disposed above the body region. The source region may be located in an entire range of the active region and a partial range of the intermediate region. The source region may be disposed on the body region so as to be in contact with the body region, or may be disposed above the body region with another region interposed therebetween. The first contact region is located in the active region and reaches the body region beyond the source region. The first contact region has a higher concentration of second conductivity-type impurities than the body region. The second contact region is located in the intermediate region, reaches the body region beyond the source region, and extends around a periphery of the source region along a peripheral edge of the source region. The second contact region has a higher concentration of the second conductivity-type impurities than the body region. The trench gate is located in the active region and extends from the first main surface beyond the source region and the body region. Concentration distributions of the second conductivity-type impurities in a depth direction of the first contact region and the second contact region match with each other.

In the semiconductor device, depths of bottom surfaces of the first contact region and the second contact region may be substantially equal to a depth of a bottom surface of the body region. In this semiconductor device, since the bottom surfaces of the second contact region and the body region are substantially flush with each other, no corner is formed between the bottom surfaces of the second contact region and the body region. Therefore, even if the second contact region is formed in the intermediate region, an electric field concentration portion is not formed.

In the semiconductor device, the semiconductor layer may further include a plurality of guard rings of the second conductivity type. The plurality of guard rings is located in the outer peripheral region and extends around the periphery of the active region and a periphery of the intermediate region. The second contact region is in contact with an innermost guard ring in the plurality of guard rings.

In the semiconductor device, the semiconductor layer may further include a current diffusion region of the first conductivity type. The current diffusion region is located in the active region and the intermediate region, is disposed between the drift region and the body region, and has a higher concentration of first conductivity-type impurities than the drift region. The current diffusion region is in contact with a side surface of the trench gate. The current diffusion region may be located in the entire range of the active region and a partial range of the intermediate region. When the current diffusion region is disposed, the semiconductor device can have low on-resistance characteristics.

In the semiconductor device, the first contact region may include a silicide layer disposed at a position in contact with a source electrode disposed on the first main surface of the semiconductor layer. In this case, the concentration distribution of the second conductivity-type impurities in the depth direction of the first contact region has a maximum concentration in the vicinity of a bottom surface of the silicide layer. In this semiconductor device, it is possible to reduce the dose of the second conductivity-type impurities for forming the first contact region while reducing a contact resistance between the first contact region and the source electrode.

In the semiconductor device, the semiconductor layer may further include a plurality of deep regions of the second conductivity type. The plurality of deep regions is located in the active region and the intermediate region, and is disposed between the drift region and the body region. The plurality of deep regions extends along a first direction when the semiconductor layer is seen in plan view, and is arranged at an interval therebetween in a second direction orthogonal to the first direction. Each of the plurality of deep regions extends from a bottom surface of the body region beyond a bottom surface of the trench gate. Each of the plurality of deep regions is in contact with the second contact region in the intermediate region. For example, the drift region or the current diffusion region may be disposed in a region between adjacent two of the plurality of deep regions. When the plurality of deep regions is disposed, the semiconductor device can have high breakdown voltage characteristics.

In the semiconductor device having the plurality of deep regions, the first direction may be parallel to a longitudinal direction of the trench gate in plan view of the semiconductor layer. In this case, one side surface of the trench gate may be covered with the first contact region and one of the plurality of deep regions. This semiconductor device can have both low on-resistance characteristics and high breakdown voltage characteristics.

In the semiconductor device having the plurality of deep regions, the first direction may intersect the longitudinal direction of the trench gate in plan view of the semiconductor layer. The first direction may be orthogonal to the longitudinal direction of the trench gate.

In the semiconductor device, the semiconductor layer may further include a plurality of deep regions of the second conductivity type. The plurality of deep regions is located in the active region and the intermediate region, and is disposed between the drift region and the body region. The plurality of deep regions may include a plurality of upper deep regions and a plurality of lower deep regions disposed below the plurality of upper deep regions. The plurality of upper deep regions extend along a first direction when the semiconductor layer is seen in plan view, and is arranged at an interval therebetween in a second direction orthogonal to the first direction. Each of the plurality of upper deep regions extends from the bottom surface of the body region beyond the bottom surface of the trench gate. Each of the plurality of upper deep regions is in contact with the second contact region in the intermediate region. The plurality of lower deep regions extend along a third direction different from the first direction when the semiconductor layer is seen in plan view, and is arranged at an interval therebetween in a fourth direction orthogonal to the third direction. Each of the plurality of lower deep regions is in contact with the plurality of upper deep regions. For example, the drift region or the current diffusion region may be disposed in a region between adjacent two of the plurality of upper deep regions. Similarly, for example, the drift region or the current diffusion region may be disposed in a region between adjacent two of the plurality of lower deep regions. When the plurality of upper deep regions and the plurality of lower deep region are disposed, the semiconductor device can have high breakdown voltage characteristics.

A manufacturing method of a semiconductor device disclosed in the present specification can include forming a first mask, forming a body region, forming a source region, forming a second mask, forming a contact region, and forming a trench gate. In the forming of the first mask, a semiconductor layer of a first conductivity type having a first main surface and a second main surface is prepared, and the first mask is formed on the first main surface of the semiconductor layer. The semiconductor layer is divided into an active region, an outer peripheral region, and an intermediate region. The outer peripheral region extends around a periphery of the active region. The intermediate region is located between the active region and the outer peripheral region and extends around the periphery of the active region. The first mask has an opening at a position corresponding to the active region and the intermediate region. The first mask may have an opening at a position corresponding to an entire range of the active region and a partial range of the intermediate region. In the forming of the body region, the body region is formed in the semiconductor layer by implanting ions of second conductivity-type impurities toward the first main surface of the semiconductor layer through the first mask. In the forming of the source region, ions of first conductivity-type impurities are implanted toward the first main surface of the semiconductor layer through the first mask to form the source region in a range shallower than the body region in the semiconductor layer. The order of the forming of the body region and the forming of the source region is not particularly limited. In the forming of the second mask, the second mask is formed on the first main surface of the semiconductor layer. In the second mask, an inner peripheral opening is formed at a predetermined position of the active region, and an outer peripheral opening is formed to extend around the source region along a peripheral edge of the source region so that the peripheral edge of the source region is exposed. In the forming of the contact region, the contact region is formed by implanting ions of the second conductivity-type impurities toward the first main surface of the semiconductor layer through the second mask. In the forming of the contact region, a first contact region of the second conductivity type is formed in the semiconductor layer at a position corresponding to the inner peripheral opening of the second mask. The first contact region reaches the body region beyond the source region and has a higher concentration of the second conductivity-type impurities than the body region. Furthermore, a second contact region of the second conductivity type is formed in the semiconductor layer at a position corresponding to the outer peripheral opening of the second mask. The second contact region reaches the body region beyond the source region and has a higher concentration of the second conductivity-type impurities than the body region. In the forming of the trench gate, the trench gate extending from the first main surface beyond the source region and the body region is formed in the active region.

In the forming of the contact region in the above-described manufacturing method, the first contact region and the second contact region may be formed so that depths of bottom surfaces of the first contact region and the second contact region are substantially equal to a depth of a bottom surface of the body region.

In the outer peripheral region of the semiconductor layer, a plurality of guard rings of a second conductivity type may be formed to extend around the periphery of the active region and the periphery of the intermediate region. In the forming of the contact region in the above-described manufacturing method, the second contact region may be formed so as to be in contact with an innermost guard ring in the plurality of guard rings. The plurality of guard rings may be simultaneously formed in the outer peripheral region when the body region is formed.

The above-described manufacturing method may further include forming a diffusion region. In the forming of the current diffusion region, ions of the first conductivity-type impurities are implanted toward the first main surface of the semiconductor layer through the first mask to form the current diffusion region in a range deeper than the body region in the semiconductor layer. The current diffusion region is formed to be in contact with a side surface of the trench gate.

Although the embodiments have been described in detail above, these are merely examples and do not limit the scope of claims. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device comprising:
a semiconductor layer having a first main surface and a second main surface and divided into an active region, an outer peripheral region, and an intermediate region, the outer peripheral region extending around a periphery of the active region, the intermediate region located between the active region and the outer peripheral region and extending around the periphery of the active region; and
a trench gate, wherein
the semiconductor layer includes:
a drift region of a first conductivity type located in the active region, the intermediate region and the outer peripheral region;
a body region of a second conductivity type located in the active region and the intermediate region and disposed above the drift region;
a source region of the first conductivity type located in the active region and the intermediate region and disposed above the body region;
a first contact region of the second conductivity type located in the active region, reaching the body region beyond the source region, and having a higher concentration of second conductivity-type impurities than the body region; and
a second contact region of the second conductivity type located in the intermediate region, reaching the body region beyond the source region, extending around the source region and the body region along peripheral edges of the source region and the body region, and having a higher concentration of the second conductivity-type impurities than the body region,
the trench gate is located in the active region and extends from the first main surface beyond the source region and the body region,
concentration distributions of the second conductivity-type impurities in a depth direction of the first contact region and the second contact region match with each other, and
the second contact region occupies a half or more range of the intermediate region in a direction connecting the active region and the outer peripheral region, and
the body region in the intermediate region is located only at a position closer to the active region than the second contact region.

2. The semiconductor device according to claim 1, wherein
depths of bottom surfaces of the first contact region and the second contact region are substantially equal to a depth of a bottom surface of the body region.

3. The semiconductor device according to claim 1, wherein
the semiconductor layer further includes a plurality of guard rings of the second conductivity type located in the outer peripheral region and extending around the periphery of the active region and a periphery of the intermediate region, and
the second contact region is in contact with an innermost guard ring in the plurality of guard rings.

4. The semiconductor device according to claim 1, wherein
the semiconductor layer further includes a current diffusion region of the first conductivity type located in the active region and the intermediate region, disposed between the drift region and the body region, and having a higher concentration of first conductivity-type impurities than the drift region, and
the current diffusion region is in contact with a side surface of the trench gate.

5. The semiconductor device according to claim 1, wherein
the first contact region includes a silicide layer disposed at a position in contact with a source electrode disposed on the first main surface of the semiconductor layer, and
the concentration distribution of the second conductivity-type impurities of the first contact region has a maximum concentration in a vicinity of a bottom surface of the silicide layer.

6. The semiconductor device according to claim 1, wherein
the semiconductor layer further includes a plurality of deep regions of the second conductivity type located in the active region and the intermediate region and disposed between the drift region and the body region,
the plurality of deep regions extends along a first direction when the semiconductor layer is seen in plan view, and is arranged at an interval therebetween in a second direction orthogonal to the first direction, each of the plurality of deep regions extends from a bottom surface of the body region beyond a bottom surface of the trench gate, and each of the plurality of deep regions is in contact with the second contact region in the intermediate region.

7. The semiconductor device according to claim 6, wherein the first direction is parallel to a longitudinal direction of the trench gate when the semiconductor layer is seen in plan view, and one side surface of the trench gate is covered by the first contact region and one of the plurality of deep regions.

8. The semiconductor device according to claim 6, wherein the first direction intersects a longitudinal direction of the trench gate when the semiconductor layer is seen in plan view.

9. The semiconductor device according to claim 1, wherein the semiconductor layer further includes a plurality of deep regions of the second conductivity type located in the active region and the intermediate region and disposed between the drift region and the body region, the plurality of deep regions includes a plurality of upper deep regions and a plurality of lower deep regions disposed below the plurality of upper deep regions, the plurality of upper deep regions extends along a first direction when the semiconductor layer is seen in plan view, and is arranged at an interval therebetween in a second direction orthogonal to the first direction, each of the plurality of upper deep regions extends from a bottom surface of the body region beyond a bottom surface of the trench gate, each of the plurality of upper deep regions is in contact with the second contact region in the intermediate region, the plurality of lower deep regions extends in a third direction different from the first direction when the semiconductor layer is seen in plan view, and is arranged at an interval therebetween in a fourth direction orthogonal to the third direction, and each of the plurality of lower deep regions is in contact with the plurality of upper deep regions.

10. A semiconductor device comprising:

a semiconductor layer having a first main surface and a second main surface and divided into an active region, an outer peripheral region, and an intermediate region, the outer peripheral region extending around a periphery of the active region, the intermediate region located between the active region and the outer peripheral region and extending around the periphery of the active region; and a trench gate, wherein the semiconductor layer includes:

a drift region of a first conductivity type located in the active region, the intermediate region and the outer peripheral region;

a body region of a second conductivity type located in the active region and the intermediate region and disposed above the drift region;

a source region of the first conductivity type located in the active region and the intermediate region and disposed above the body region;

a first contact region of the second conductivity type located in the active region, reaching the body region beyond the source region, and having a higher concentration of second conductivity-type impurities than the body region; and a second contact region of the second conductivity type located in the intermediate region, reaching the body region beyond the source region, extending around the source region along a peripheral edge of the source region, and having a higher concentration of the second conductivity-type impurities than the body region, the trench gate is located in the active region and extends from the first main surface beyond the source region and the body region, concentration distributions of the second conductivity-type impurities in a depth direction of the first contact region and the second contact region match with each other, the second contact region occupies a half or more range of the intermediate region in a direction connecting the active region and the outer peripheral region, the semiconductor layer further includes a plurality of guard rings of the second conductivity type located in the outer peripheral region and extending around the periphery of the active region and a periphery of the intermediate region, and the second contact region is in contact with an innermost guard ring in the plurality of guard rings.

11. A semiconductor device comprising:

a semiconductor layer having a first main surface and a second main surface and divided into an active region, an outer peripheral region, and an intermediate region, the outer peripheral region extending around a periphery of the active region, the intermediate region located between the active region and the outer peripheral region and extending around the periphery of the active region; and a trench gate, wherein the semiconductor layer includes:

a drift region of a first conductivity type located in the active region, the intermediate region and the outer peripheral region;

a body region of a second conductivity type located in the active region and the intermediate region and disposed above the drift region;

a source region of the first conductivity type located in the active region and the intermediate region and disposed above the body region;

a first contact region of the second conductivity type located in the active region, reaching the body region beyond the source region, and having a higher concentration of second conductivity-type impurities than the body region; and a second contact region of the second conductivity type located in the intermediate region, reaching the body region beyond the source region, extending around the source region along a peripheral edge of the source region, and having a higher concentration of the second conductivity-type impurities than the body region, the trench gate is located in the active region and extends from the first main surface beyond the source region and the body region, concentration distributions of the second conductivity-type impurities in a depth direction of the first contact region and the second contact region match with each other, the second contact region occupies a half or more range of the intermediate region in a direction connecting the active region and the outer peripheral region, the first contact region includes a silicide layer disposed at a position in contact with a source electrode disposed on the first main surface of the semiconductor layer, and the concentration distribution of the second conductivity-type impurities of the first contact region has a maximum concentration in a vicinity of a bottom surface of the silicide layer.

\* \* \* \* \*